US010847603B2

(12) United States Patent
Moon et al.

(10) Patent No.: US 10,847,603 B2
(45) Date of Patent: Nov. 24, 2020

(54) INTEGRATED CIRCUIT DEVICE AND METHOD OF FABRICATING THE SAME

(71) Applicant: SAMSUNG ELECTRONICS CO., LTD., Suwon-si (KR)

(72) Inventors: Sun-min Moon, Yongin-si (KR); Su-hwan Kim, Seoul (KR); Hyun-jun Kim, Seoul (KR); Seong-yul Park, Seoul (KR); Young-lim Park, Anyang-si (KR); Jae-wan Chang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 16/361,469

(22) Filed: Mar. 22, 2019

(65) Prior Publication Data

US 2020/0091279 A1 Mar. 19, 2020

(30) Foreign Application Priority Data

Sep. 19, 2018 (KR) .................. 10-2018-0112381

(51) Int. Cl.
| | | |
|---|---|---|
| *H01L 49/02* | (2006.01) | |
| *H01L 21/311* | (2006.01) | |
| *H01L 21/285* | (2006.01) | |
| *H01L 21/02* | (2006.01) | |
| *H01L 21/321* | (2006.01) | |
| *H01L 27/108* | (2006.01) | |

(52) U.S. Cl.
CPC .......... *H01L 28/40* (2013.01); *H01L 21/0228* (2013.01); *H01L 21/02181* (2013.01); *H01L 21/02186* (2013.01); *H01L 21/02205* (2013.01); *H01L 21/28568* (2013.01); *H01L 21/31144* (2013.01); *H01L 21/3212* (2013.01); *H01L 28/92* (2013.01); *H01L 27/10852* (2013.01)

(58) Field of Classification Search
CPC ................................. H01L 28/40–57
See application file for complete search history.

(56) References Cited

U.S. PATENT DOCUMENTS

| | | | |
|---|---|---|---|
| 7,871,889 B2 | 1/2011 | Park | |
| 2006/0006450 A1 | 1/2006 | Al-Shareef et al. | |
| 2009/0309187 A1 | 12/2009 | Choi et al. | |
| 2011/0048769 A1 | 3/2011 | Fujiwara | |
| 2011/0151639 A1* | 6/2011 | Lim | C01G 25/02 |
| | | | 438/381 |
| 2011/0222207 A1 | 9/2011 | Lee et al. | |
| 2018/0315811 A1* | 11/2018 | Cho | H01L 28/91 |
| 2019/0013391 A1* | 1/2019 | Moon | H01L 21/76221 |

FOREIGN PATENT DOCUMENTS

| | | |
|---|---|---|
| JP | 2011-54708 A | 3/2011 |
| KR | 10-2011-0103534 A | 1/2001 |
| KR | 10-2008-0084400 A | 9/2008 |
| KR | 10-0965771 B1 | 6/2010 |
| KR | 10-0996884 B1 | 11/2010 |
| KR | 10-2011-0004670 A | 1/2011 |
| KR | 10-2015-0037009 A | 4/2015 |

* cited by examiner

*Primary Examiner* — Robert G Bachner
*Assistant Examiner* — Molly K Reida
(74) *Attorney, Agent, or Firm* — Sughrue Mion, PLLC

(57) ABSTRACT

In a capacitor of an integrated circuit, a crystallization induction film is obtained by oxidizing a surface of an electrode, and a dielectric structure is formed on the crystallization induction film, to reduce defect density generated in the dielectric film, improve leakage current, and reduce equivalent oxide thickness.

20 Claims, 23 Drawing Sheets

INTEGRATED CIRCUIT DEVICE AND METHOD OF FABRICATING THE SAME

CROSS-REFERENCE TO RELATED APPLICATION(S)

This application claims priority from Korean Patent Application No. 10-2018-0112381, filed on Sep. 19, 2018, in the Korean Intellectual Property Office, the disclosure of which is herein incorporated by reference in its entirety.

BACKGROUND

Methods and apparatuses of the disclosure relate to an integrated circuit device and a method of fabricating the integrated circuit device, and more particularly, to an integrated circuit device having a dielectric film and a method of fabricating the integrated circuit device having the dielectric film.

Semiconductor devices have been rapidly down-scaled with the advancement of electronic technology. Accordingly, patterns constituting electronic devices have been correspondingly reduced. In addition, there is a need to develop a structure capable of reducing leakage current from a fine-sized capacitor and maintaining desired electrical properties even if a dielectric film having a relatively low thickness is formed in the fine-sized capacitor.

SUMMARY

Embodiments of the disclosure provide an integrated circuit device that may reduce leakage current from a capacitor and maintain desired electrical properties.

Embodiments of the disclosure also provide a method of fabricating an integrated circuit device that may reduce leakage current from a capacitor and maintain desired electrical properties.

According to an embodiment of the disclosure, there is provided an integrated circuit device, which includes: an electrode comprising a first metal; a buffer layer disposed on the electrode, the buffer layer comprising the first metal, oxygen atoms, and nitrogen atoms; and a dielectric structure disposed on the buffer layer, wherein the dielectric structure includes: a crystallization induction film disposed on the buffer layer, the crystallization induction film comprising a first metal oxide film, the first metal oxide film comprising the first metal; and a first dielectric film disposed on the crystallization induction film, the first dielectric film comprising a second metal oxide film, the second metal oxide film comprising a second metal.

According to an embodiment of the disclosure, there is provided an integrated circuit device, which includes: a substrate, a bottom electrode disposed over the substrate, the bottom electrode comprising a first metal; a top electrode disposed over the bottom electrode; a dielectric structure disposed between the bottom electrode and the top electrode, and a buffer layer disposed between the bottom electrode and the dielectric structure, the buffer layer comprising the first metal, oxygen atoms, and nitrogen atoms, wherein the dielectric structure includes: a crystallization induction film disposed on the buffer layer; and a first dielectric film disposed on the crystallization induction film, the first dielectric film comprising a second metal oxide film, the second metal oxide film comprising a second metal.

According to an embodiment of the disclosure, there is provided an integrated circuit device, which includes: a substrate, a bottom electrode disposed over the substrate, the bottom electrode comprising a first metal; a top electrode disposed over the bottom electrode; a dielectric structure disposed between the bottom electrode and the top electrode, the dielectric structure including a crystallization induction film comprising a first metal oxide film, the first metal oxide film comprising a first metal, and the crystallization induction film disposed over a surface of the bottom electrode, a first dielectric film disposed on the crystallization induction film, the first dielectric film having a first band gap, and a second dielectric film disposed on the first dielectric film, the second dielectric film having a second band gap that is greater than the first band gap; and a buffer layer disposed between the bottom electrode and the crystallization induction film, the buffer layer comprising the first metal, oxygen atoms, and nitrogen atoms.

According to an embodiment of the disclosure, there is provided a method of fabricating an integrated circuit device, the method including: forming an electrode over a substrate, the electrode including a first metal; partially oxidizing the electrode to form a crystallization induction film on a surface of the electrode by, the crystallization induction film comprising a first metal oxide film, the first metal oxide film comprising the first metal; and forming a first dielectric film on the crystallization induction film, the first dielectric film comprising a second metal oxide film, the second metal oxide film comprising a second metal.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
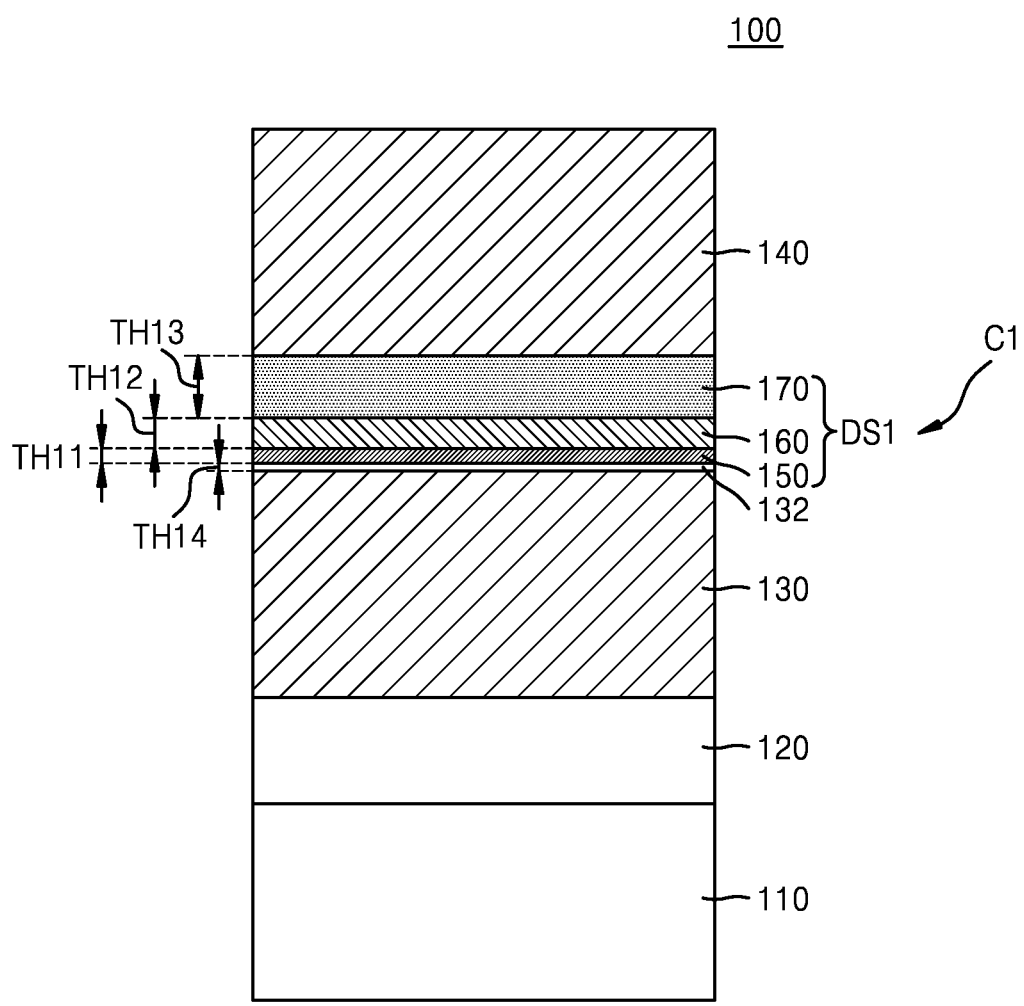
FIG. 1 is a cross-sectional view illustrating a main configuration of an integrated circuit device, according to an embodiment.

Hereinafter, embodiments of the disclosure will be described in detail with reference to the accompanying drawings. Like components will be denoted by like reference numerals throughout the specification, and repeated descriptions thereof will be omitted. Expressions such as "at least one of," when preceding a list of elements, modify the entire list of elements and do not modify the individual elements of the list. For example, the expressions "at least one of a, b, and c," "at least one of a, b, or c," and "at least one of a, b, and/or c," should be understood as including only a, only b, only c, both a and b, both a and c, both b and c, or all of a, b, and c.

FIG. 1 is a cross-sectional view illustrating a main configuration of an integrated circuit device 100, according to an embodiment.

Referring to FIG. 1, the integrated circuit device 100 includes a substrate 110, a lower structure 120 on the substrate 110, and a capacitor C1 disposed on the lower structure 120.

The substrate 110 may include a semiconductor element such as Si or Ge, or a compound semiconductor such as SiC, GaAs, InAs, or InP. The substrate 110 may include a semiconductor substrate and structures including at least one insulating film or at least one conductive region arranged over the semiconductor substrate. The conductive region may include, for example, an impurity-doped well or an impurity-doped structure. In some embodiments, the substrate 110 may have various device isolation structures such as a shallow trench isolation (STI) structure.

In some embodiments, the lower structure 120 may include an insulating film. In some other embodiments, the lower structure 120 may include various conductive regions, for example, a wiring layer, a contact plug, a transistor, and the like, and an insulating film insulating these conductive regions from each other.

The capacitor C1 may include a bottom electrode 130 and a top electrode 140, which oppose each other, and a dielectric structure DS1 disposed between the bottom electrode 130 and the top electrode 140.

Each of the bottom electrode 130 and the top electrode 140 may include a metal film including a first metal, a metal oxide film including the first metal, a metal nitride film including the first metal, a metal oxynitride film including the first metal, or a combination thereof.

In some embodiments, the first metal may be a transition metal or a post-transition metal. For example, the first metal may be Ti, Co, Nb, or Sn. In some embodiments, each of the bottom electrode 130 and the top electrode 140 may include Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, although each of the bottom electrode 130 and the top electrode 140 may include TiN, CoN, NbN, $SnO_2$, or a combination thereof, a constituent material of each of the bottom electrode 130 and the top electrode 140 is not limited thereto.

The dielectric structure DS1 may include a crystallization induction film 150, a first dielectric film 160, and a second dielectric film 170. The crystallization induction film 150 may be arranged between the bottom electrode 130 and the first dielectric film 160. A bottom surface of the first dielectric film 160 may contact a top surface of the crystallization induction film 150, and a top surface of the first dielectric film 160 may contact a bottom surface of the second dielectric film 170. The second dielectric film 170 may be arranged between the first dielectric film 160 and the top electrode 140.

The crystallization induction film 150 may include a first metal oxide film including the first metal. In some embodiments, the crystallization induction film 150 may include a Ti oxide film, a Co oxide film, a Nb oxide film, or a Sn oxide film. In some embodiments, the first metal oxide film constituting the crystallization induction film 150 may include a crystalline metal oxide. For example, the first metal oxide film may have a rutile structure. The crystallization induction film 150 may have a thickness TH11 of about 3 Angstrom (Å) to about 7 Å. In the case that the first metal oxide film includes a $TiO_2$ film having a rutile structure, the crystallization induction film 150 may have a relatively high dielectric constant of about 80 to about 130 even though having a relatively low thickness of about 7 Å or less. The $TiO_2$ film having a rutile structure may have a band gap of about 3.1 eV.

The first dielectric film 160 may include a second metal oxide film including a second metal. The second metal may be different from the first metal included in the bottom electrode 130 and the crystallization induction film 150. For example, the second metal may be Hf, Zr, Nb, Ce, or Ti. In some embodiments, the first dielectric film 160 may include $HfO_2$, $ZrO_2$, $Nb_2O_5$, $CeO_2$, or $TiO_2$. In some other embodiments, the first dielectric film 160 may include a metalloid oxide. For example, the first dielectric film 160 may include $GeO_2$.

The thickness TH11 of the crystallization induction film 150 may be less than a thickness TH12 of the first dielectric film 160. In some embodiments, the thickness TH11 of the crystallization induction film 150 may range from about 3 Å to about 7 Å, and the thickness TH12 of the first dielectric film 160 may range from about 30 Å to about 50 Å, without being limited thereto.

The crystallization induction film 150 may provide surface stress such that the first dielectric film 160 arranged directly on the crystallization induction film 150 has a preferred orientation of a tetragonal phase. The first dielectric film 160 may maintain a crystalline structure of a tetragonal phase due to interfacial energy properties at the top surface of the crystallization induction film 150, which contacts the bottom surface of the first dielectric film 160. In some embodiments, all portions of the first dielectric film 160 may include tetragonal phases. In some other embodiments, most portions of the first dielectric film 160 may include tetragonal phases, and some portions of the first dielectric film 160, which are disposed apart from contact with the crystallization induction film 150, may include monoclinic phases. The portions of the first dielectric film 160, which include monoclinic phases, may be present in an amount of about 0% by volume (vol %) to about 20% by volume based on the total volume of the first dielectric film 160.

In some embodiments, the bottom electrode 130 may include a TiN film, the crystallization induction film 150 may include a $TiO_2$ film having a rutile structure, and the first dielectric film 160 may include a $HfO_2$ film having a tetragonal phase. The $HfO_2$ film having a tetragonal phase may have a relatively high dielectric constant of about 70, which is higher than a dielectric constant of a $HfO_2$ film having a monoclinic phase. Thus, the first dielectric film 160 may have a tetragonal phase and provide a relatively high dielectric constant, thereby contributing to reducing an equivalent oxide thickness of the dielectric structure DS1. In particular, in the case that the first dielectric film 160 includes a $HfO_2$ film having a tetragonal phase, even though the thickness TH12 of the first dielectric film 160 is about 50 Å or has a relatively high value greater than about 50 Å, the $HfO_2$ film maintains a tetragonal phase and thus has a relatively high dielectric constant, whereby the dielectric structure DS1 may have an increased dielectric constant. As a result, the equivalent oxide thickness of the dielectric structure DS1 may be reduced even when the thickness TH12 of the first dielectric film 160 is relatively high.

In some embodiments, a difference (a lattice mismatch) between a first lattice constant of the first metal oxide film constituting the crystallization induction film 150 and a second lattice constant of the second metal oxide film constituting the first dielectric film 160 may be equal to or less than about 15% of one of the first lattice constant and the second lattice constant. That is, the difference between the first lattice constant of the first metal oxide film constituting the crystallization induction film 150 and the second lattice constant of the second metal oxide film constituting the first dielectric film 160 may be about 15% or less. For example, the lattice mismatch between the first metal oxide film and the second metal oxide film may be about 5% or less.

In some embodiments, each of the bottom electrode 130 and the top electrode 140 may have a band gap of about 3.5 eV or less, and the first dielectric film 160 may have a band gap of about 3.5 eV or more.

In some embodiments, the band gap of the first dielectric film 160 may be greater than the band gap of the crystallization induction film 150. For example, the crystallization induction film 150 may include a $TiO_2$ film, and the first dielectric film 160 may include a $HfO_2$ film. In this case, the $HfO_2$ film may have a band gap of about 5.68 eV, which is greater than a band gap (about 3.1 eV) of the $TiO_2$ film. Thus, because a potential barrier between the bottom electrode 130 and the dielectric structure DS1 and a potential barrier between the top electrode 140 and the dielectric structure DS1 may be increased, oxygen in the dielectric structure DS1 may be suppressed from transitioning to the bottom electrode 130 or the top electrode 140. Therefore, deterioration in electrical properties of the dielectric structure DS1 may be prevented and relatively high capacitance may be provided while the generation of leakage current from the capacitor C1 is suppressed.

The second dielectric film 170 may oppose the bottom electrode 130 with the crystallization induction film 150 and the first dielectric film 160 disposed therebetween. A band gap of the second dielectric film 170 may be greater than the band gap of the first dielectric film 160. The second dielectric film 170 may include a metal oxide, and a metal constituting the second dielectric film 170 may be different from the first metal and the second metal. In some embodiments, the second dielectric film 170 may include $ZrO_2$, $Al_2O_3$, $Nb_2O_5$, $CeO_2$, $La_2O_3$, $Ta_2O_3$, $TiO_2$, or a combination thereof. The second dielectric film 170 may include a single layer including one selected from among the example materials set forth above, or a multi-layer in which a plurality of layers are stacked, the stacked layers including different materials selected from among the example materials set forth above.

In some embodiments, when the second dielectric film 170 is multi-layered, a portion of the second dielectric film 170, which contacts the top surface of the first dielectric film 160, may include a $ZrO_2$ film including a tetragonal phase or a monoclinic phase. For example, the first dielectric film 160 may include a $HfO_2$ film, and the second dielectric film 170 may include a $ZrO_2$ film contacting the first dielectric film 160. In this case, while contacting the top surface of the first dielectric film 160, the second dielectric film 170 may provide surface stress to the first dielectric film 160 such that the first dielectric film 160 may maintain a tetragonal phase. In addition, the $ZrO_2$ film may have a band gap of about 7.8 eV, which is greater than a band gap (about 5.68 eV) of the $HfO_2$ film. Therefore, the generation of leakage current through the dielectric structure DS1 may be suppressed by the second dielectric film 170, and hence the capacitor C1 having relatively high capacitance may be provided.

A thickness TH13 of the second dielectric film 170 may be greater than the thickness TH12 of the first dielectric film 160. In some embodiments, the thickness TH13 of the second dielectric film 170 may range from about 70 Å to about 90 Å, without being limited thereto.

The capacitor C1 of the integrated circuit device 100 may further include a buffer layer 132 between the bottom electrode 130 and the crystallization induction film 150. The buffer layer 132 may include the first metal, oxygen atoms, and nitrogen atoms. For example, when the bottom electrode 130 and the crystallization induction film 150 include Ti, the buffer layer 132 may also include Ti. In some embodiments, the bottom electrode 130 may include a TiN film, the crystallization induction film 150 may include a $TiO_2$ film, and the buffer layer 132 may include a TiON film. Nitrogen atom content in the buffer layer 132 may vary in a thickness direction of the buffer layer 132. For example, the nitrogen atom content in the buffer layer 132 may gradually decrease with decreasing distance from the crystallization induction film 150 and may gradually increase with decreasing distance from the bottom electrode 130. As used herein, the term "nitrogen atom content" refers to an amount of nitrogen atoms per unit volume.

The buffer layer 132 may function as a barrier preventing diffusion of oxygen from the dielectric structure DS1 toward the bottom electrode 130. As such, the buffer layer 132 is arranged between the bottom electrode 130 and the dielectric structure DS1, whereby a high-resistance material, which is likely to be formed in some regions of the bottom electrode 130 due to oxygen atoms diffused into the bottom electrode 130, may be prevented from being formed, and thus, an increase in resistance of the bottom electrode 130 may be suppressed.

In some embodiments, a thickness TH14 of the buffer layer 132 may be equal to or less than the thickness TH11 of the crystallization induction film 150. For example, the thickness TH14 of the buffer layer 132 may range from about 2 Å to about 7 Å. Each of the thickness TH11 of the crystallization induction film 150 and the thickness TH14 of the buffer layer 132 may be adaptively determined depending upon electrical properties to be exhibited by the capacitor C1.

Figure 2:
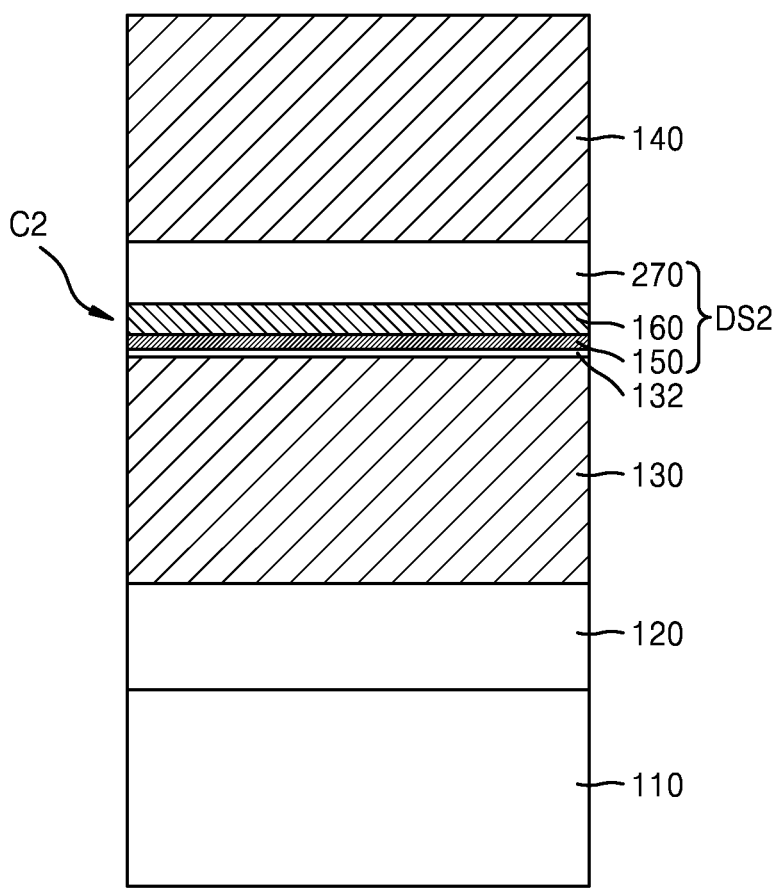
FIG. 2 is a cross-sectional view illustrating a main configuration of an integrated circuit device, according to an embodiment.

FIG. 2 is a cross-sectional view illustrating a main configuration of an integrated circuit device 200, according to an embodiment. In FIG. 2, the same reference numerals as in FIG. 1 respectively denote the same members, and detailed descriptions thereof will be omitted.

Referring to FIG. 2, a capacitor C2 of the integrated circuit device 200 has a substantially identical configuration to the capacitor C1 of the integrated circuit device 100 shown in FIG. 1. However, in the integrated circuit device 200, a dielectric structure DS2 of the capacitor C2 includes a second dielectric film 270 disposed between the first dielectric film 160 and the top electrode 140.

The second dielectric film 270 may have a single-layer structure including a $ZrO_2$ film. The second dielectric film 270 may include a tetragonal phase or a monoclinic phase. The $ZrO_2$ film constituting the second dielectric film 270 may contact the top surface of the first dielectric film 160 and thus provide surface stress to the first dielectric film 160 such that the first dielectric film 160 may maintain a tetragonal phase. A top surface of the second dielectric film 270 may contact the bottom surface of the top electrode 140. For more descriptions of the second dielectric film 270, reference may be made to the descriptions of the second dielectric film 170, which have been given with reference to FIG. 1.

Figure 3:
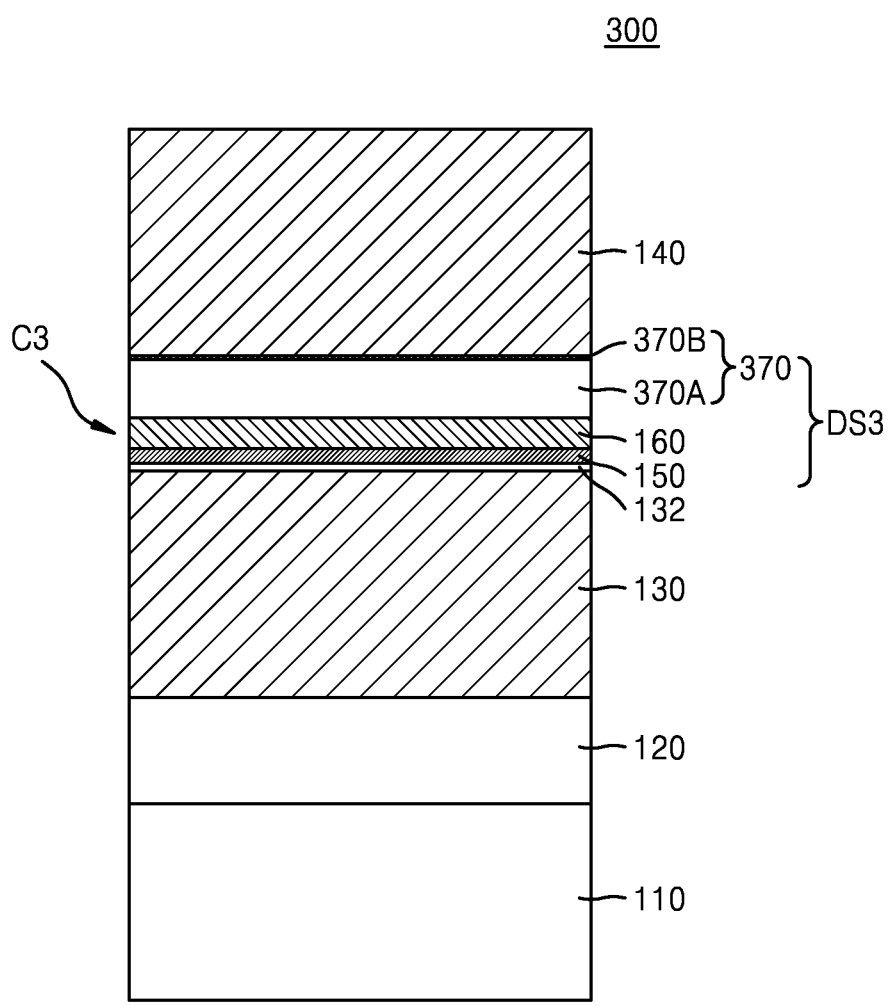
FIG. 3 is a cross-sectional view illustrating a main configuration of an integrated circuit device, according to an embodiment.

FIG. 3 is a cross-sectional view illustrating a main configuration of an integrated circuit device 300, according to an embodiment. In FIG. 3, the same reference numerals as in FIG. 1 respectively denote the same members, and detailed descriptions thereof will be omitted.

Referring to FIG. 3, a capacitor C3 of the integrated circuit device 300 has a substantially identical configuration to the capacitor C1 of the integrated circuit device 100 shown in FIG. 1. However, in the integrated circuit device 300, a dielectric structure DS3 of the capacitor C3 includes a composite dielectric film structure 370 disposed between the first dielectric film 160 and the top electrode 140. The composite dielectric film structure 370 includes a plurality of dielectric films including materials different from each other.

The composite dielectric film structure 370 may include a second dielectric film 370A and a third dielectric film 370B, which are sequentially stacked on the first dielectric film 160, namely the second dielectric film 370A is stacked on the dielectric film 160 and the third dielectric film 370B is stacked on the second dielectric film 370A. The second dielectric film 370A may oppose the bottom electrode 130, with the buffer layer 132, the crystallization induction film 150, and the first dielectric film 160 being disposed between the second dielectric film 370A and the bottom electrode 130, and may oppose the top electrode 140, with the third dielectric film 370B being disposed between the second dielectric film 370A and the top electrode 140. A bottom surface of the second dielectric film 370A may contact the top surface of the first dielectric film 160, and a top surface of the second dielectric film 370A may contact a bottom surface of the third dielectric film 370B. A top surface of the third dielectric film 370B may contact the bottom surface of the top electrode 140. For more descriptions of the second dielectric film 370A, reference may be made to the descriptions of the second dielectric film 170, which have been given with reference to FIG. 1.

In some embodiments, the second dielectric film 370A and the third dielectric film 370B may respectively include different films selected from among a $ZrO_2$ film, an $Al_2O_3$ film, a $Nb_2O_5$ film, a $CeO_2$ film, a $La_2O_3$ film, a $Ta_2O_3$ film, and a $TiO_2$ film.

A thickness of the second dielectric film 370A may be greater than a thickness of the third dielectric film 370B. In some embodiments, the thickness of the second dielectric film 370A may range from about 70 Å to about 90 Å, and the thickness of the third dielectric film 370B may range from about 3 Å to about 7 Å, without being limited thereto.

A band gap of the second dielectric film 370A may be different from a band gap of the third dielectric film 370B. In some embodiments, a band gap of the third dielectric film 370B may be greater than a band gap of the second dielectric film 370A. For example, the second dielectric film 370A may include a $ZrO_2$ film, and the third dielectric film 370B may include an $Al_2O_3$ film. A band gap of the $Al_2O_3$ film is about 8.7 eV, which is greater than about 7.8 eV that is a band gap of the $ZrO_2$ film. The composite dielectric film structure 370 includes the third dielectric film 370B having a relatively wide band gap, whereby the generation of leakage current from the capacitor C3 may be suppressed and relatively high capacitance may be provided.

Figure 4A:
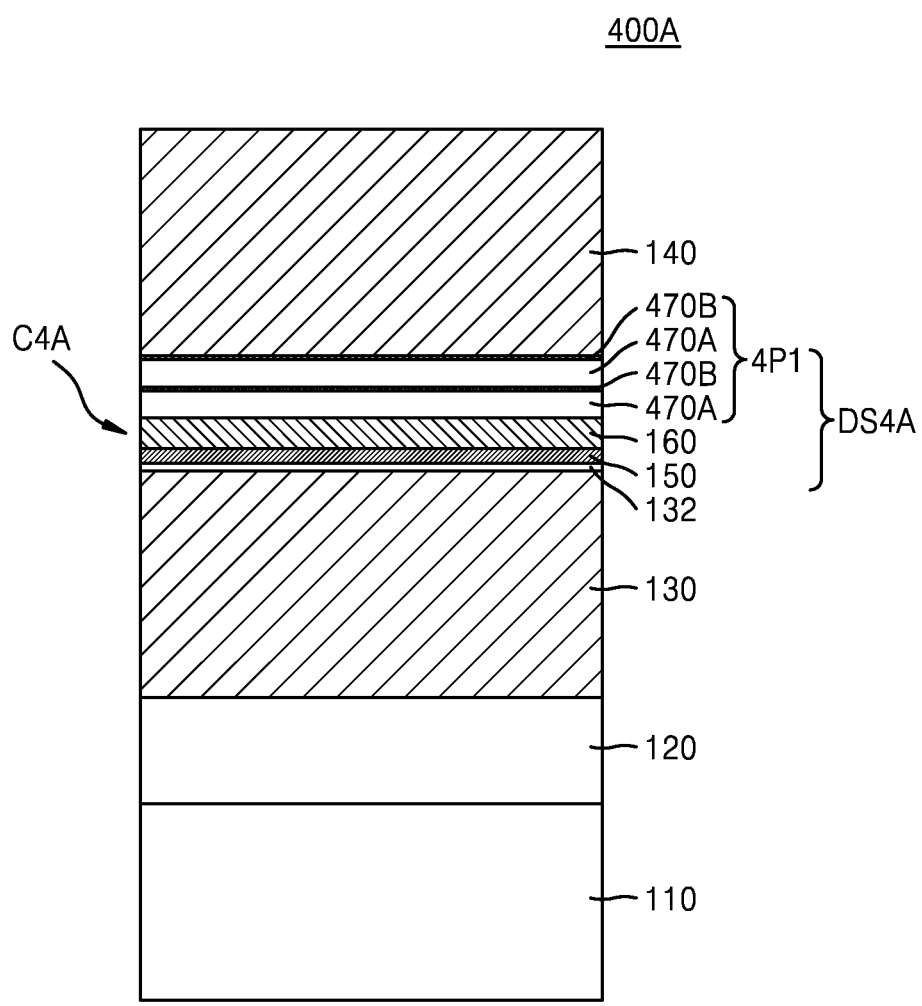
FIGS. 4A and 4B are cross-sectional views, each illustrating a main configuration of an integrated circuit device, according to an embodiment.

FIG. 4A is a cross-sectional view illustrating a main configuration of an integrated circuit device 400A, according to an embodiment. In FIG. 4A, the same reference numerals as in FIG. 1 respectively denote the same members, and detailed descriptions thereof will be omitted.

Referring to FIG. 4A, a capacitor C4A of the integrated circuit device 400A has a substantially identical configuration to the capacitor C1 of the integrated circuit device 100 shown in FIG. 1. However, in the integrated circuit device 400A, a dielectric structure DS4A of the capacitor C4A includes a composite dielectric film structure 4P1 disposed between the first dielectric film 160 and the top electrode 140. The composite dielectric film structure 4P1 includes a plurality of dielectric films including materials different from each other.

The composite dielectric film structure 4P1 may include two second dielectric films 470A disposed apart from each other and two third dielectric films 470B apart from each other. In the composite dielectric film structure 4P1, the two second dielectric films 470A and the two third dielectric films 470B may be alternately stacked one by one on the first dielectric film 160. A bottom surface of a second dielectric film 470A closest to the bottom electrode 130, out of the two second dielectric films 470A, contacts the top surface of the first dielectric film 160. A top surface of the third dielectric film 470B farthest from the bottom electrode 130, out of the two third dielectric films 470B, contacts the bottom surface of the top electrode 140. In some embodiments, each second dielectric film 470A and each third dielectric film 470B may respectively include different films selected from among a $ZrO_2$ film, an $Al_2O_3$ film, a $Nb_2O_5$ film, a $CeO_2$ film, a $La_2O_3$ film, a $Ta_2O_3$ film, and a $TiO_2$ film.

A thickness of each second dielectric film 470A may be greater than a thickness of each third dielectric film 470B. The two second dielectric films 470A may have thicknesses equal to or different from each other. The two third dielectric films 470B may have thicknesses equal to or different from each other. In some embodiments, the thickness of each second dielectric film 470A may be selected from a range of about 10 Å to about 50 Å, and the thickness of each third dielectric film 470B may be selected from a range of about 3 Å to about 7 Å, without being limited thereto.

Each second dielectric film 470A and each third dielectric film 470B may have band gaps different from each other. In some embodiments, a band gap of each third dielectric film 470B may be greater than a band gap of each second dielectric film 470A. For example, each second dielectric film 470A may include a $ZrO_2$ film, and each third dielectric film 470B may include an $Al_2O_3$ film. The composite dielectric film structure 4P1 includes a plurality of third dielectric films 470B having relatively wide band gaps, whereby the generation of leakage current from the capacitor C4A may be suppressed and relatively high capacitance may be provided.

Although FIG. 4A illustrates an example in which the composite dielectric film structure 4P1 includes the two second dielectric films 470A and the two third dielectric films 470B, the embodiment is not limited thereto. For example, the composite dielectric film structure 4P1 may include at least three second dielectric films 470A and at least three third dielectric films 470B and may have a structure in which the at least three second dielectric films 470A and the at least three third dielectric films 470B are alternately stacked one by one on the first dielectric film 160. However, the embodiment is not limited thereto, and the quantity of second dielectric films 470A and third dielectric films 470B may be greater than three.

Figure 4B:
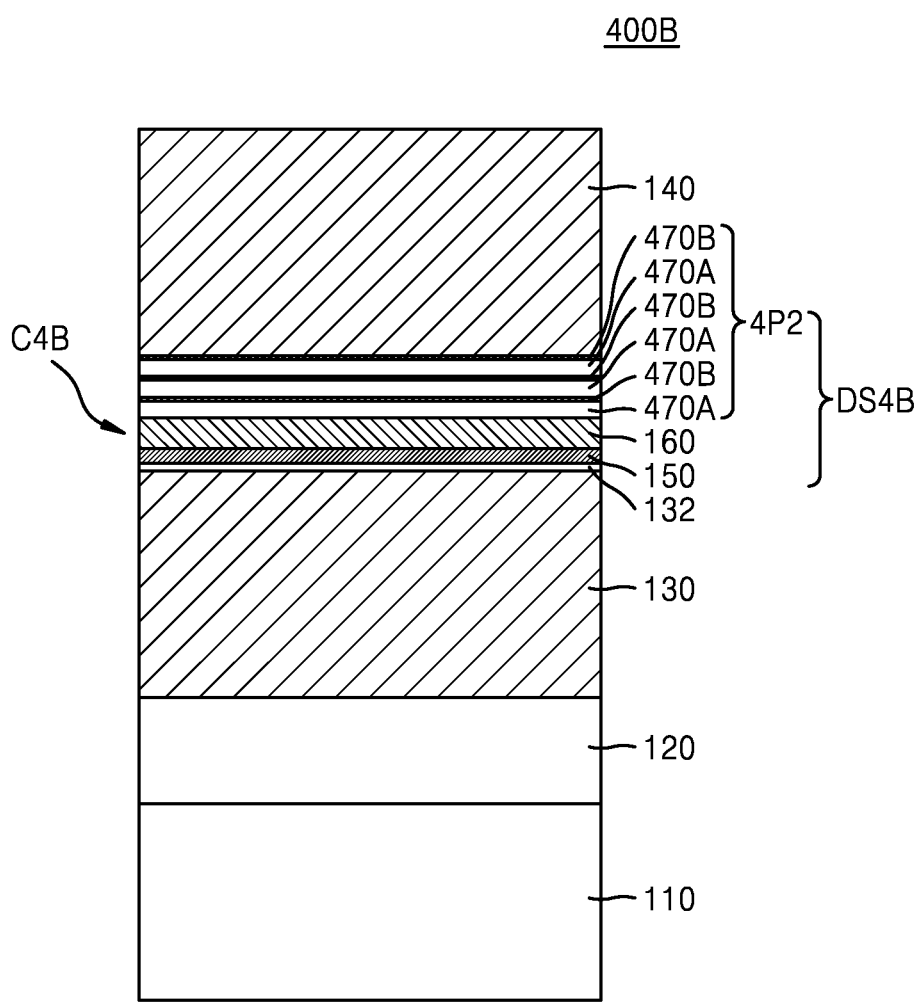

FIG. 4B is a cross-sectional view illustrating a main configuration of an integrated circuit device 400B, according to an embodiment. In FIG. 4B, the same reference numerals as in FIG. 4A respectively denote the same members, and detailed descriptions thereof will be omitted.

Referring to FIG. 4B, a capacitor C4B of the integrated circuit device 400B has a substantially identical configuration to the capacitor C4A of the integrated circuit device 400A, which has been described with reference to FIG. 4A. However, in the integrated circuit device 400B, a dielectric structure DS4B of the capacitor C4B includes a composite dielectric film structure 4P2. The composite dielectric film structure 4P2 may include a plurality of dielectric films including materials different from each other.

The composite dielectric film structure 4P2 may include three second dielectric films 470A disposed apart from each other and three third dielectric films 470B disposed apart from each other. In the composite dielectric film structure 4P2, the three second dielectric films 470A and the three third dielectric films 470B may be alternately stacked one by one on the first dielectric film 160. A bottom surface of the second dielectric film 470A closest to the bottom electrode 130, out of the three second dielectric films 470A, contacts the top surface of the first dielectric film 160, and a top surface of the third dielectric film 470B farthest from the bottom electrode 130, out of the three third dielectric films 470B, contacts the bottom surface of the top electrode 140. The three second dielectric films 470A may have thicknesses equal to or different from each other. The three third dielectric films 470B may have thicknesses equal to or different from each other. For more descriptions of each second dielectric film 470A and each third dielectric film 470B, reference may be made to the descriptions thereof given with reference to FIG. 4A.

Figure 5:
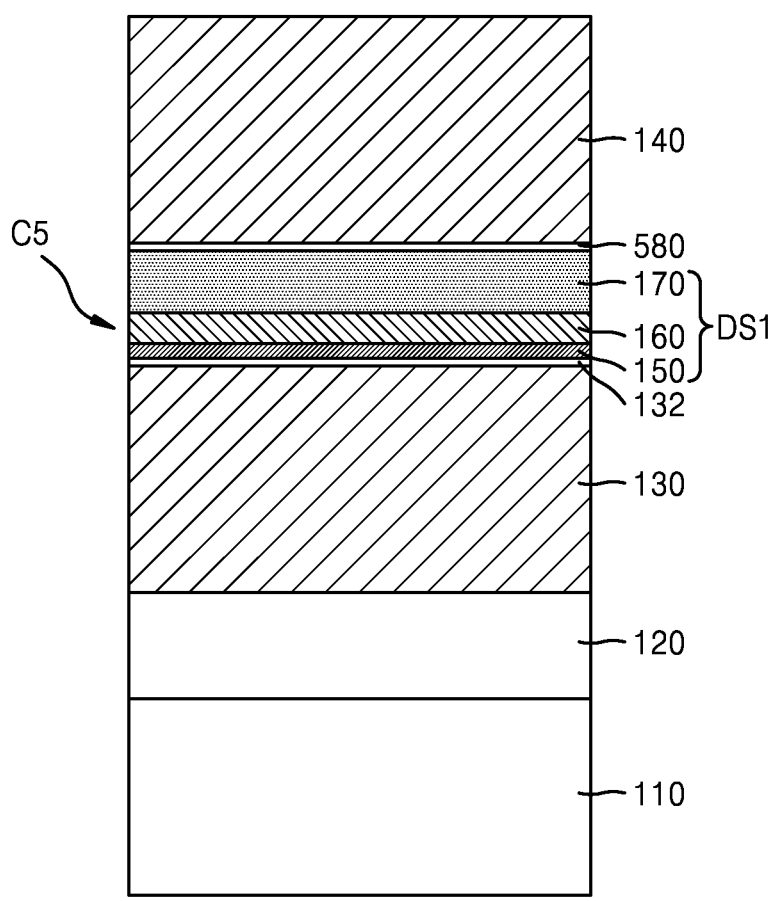
FIG. 5 is a cross-sectional view illustrating a main configuration of an integrated circuit device, according to an embodiment.

FIG. 5 is a cross-sectional view illustrating a main configuration of an integrated circuit device 500, according to an embodiment. In FIG. 5, the same reference numerals as in FIG. 1 respectively denote the same members, and detailed descriptions thereof will be omitted.

Referring to FIG. 5, a capacitor C5 of the integrated circuit device 500 has a substantially identical configuration to the capacitor C1 of the integrated circuit device 100 shown in FIG. 1. However, in the integrated circuit device 500, the capacitor C5 further includes an interfacial film 580 disposed between the dielectric structure DS1 and the top electrode 140.

The interfacial film 580 may include a third metal oxide film including a third metal. The third metal may be different from the first metal included in the bottom electrode 130 and the crystallization induction film 150. In some embodiments, the third metal may be Ti or Zr. For example, the interfacial film 580 may include a $TiO_2$ film or a $ZrO_2$ film. The interfacial film 580 may have a thickness of about 1 Å to about 15 Å, without being limited thereto. The thickness of the interfacial film 580 may be adaptively determined depending upon electrical properties to be exhibited by the capacitor C5.

The interfacial film 580 may function as a barrier preventing diffusion of oxygen from the dielectric structure DS1 toward the top electrode 140. As such, the interfacial film 580 is arranged between the top electrode 140 and the dielectric structure DS1, whereby an increase in resistance of the top electrode 140 may be suppressed.

An example, in which the capacitor C5 of the integrated circuit device 500 further includes the interfacial film 580 between the dielectric structure DS1 and the top electrode 140 although having a substantially identical configuration to the capacitor C1 of the integrated circuit device 100 shown in FIG. 1, has been described with reference to FIG. 5. However, according to the embodiment, the configuration including the interfacial film 580 is not limited to the example shown in FIG. 5. As an example, in the integrated circuit device 200 shown in FIG. 2, the interfacial film 580 described with reference to FIG. 5 may be arranged between the second dielectric film 270 of the dielectric structure DS2 and the top electrode 140. As another example, in the integrated circuit device 300 shown in FIG. 3, the interfacial film 580 described with reference to FIG. 5 may be arranged between the third dielectric film 370B of the dielectric structure DS3 and the top electrode 140. As yet another example, in each of the integrated circuit device 400A shown in FIG. 4A and the integrated circuit device 400B shown in FIG. 4B, the interfacial film 580 described with reference to FIG. 5 may be arranged between the top electrode 140 and the third dielectric film 470B that is closest to the top electrode 140 among the plurality of third dielectric films 470B included in each of the dielectric structures DS4A and DS4B.

Figure 6A:
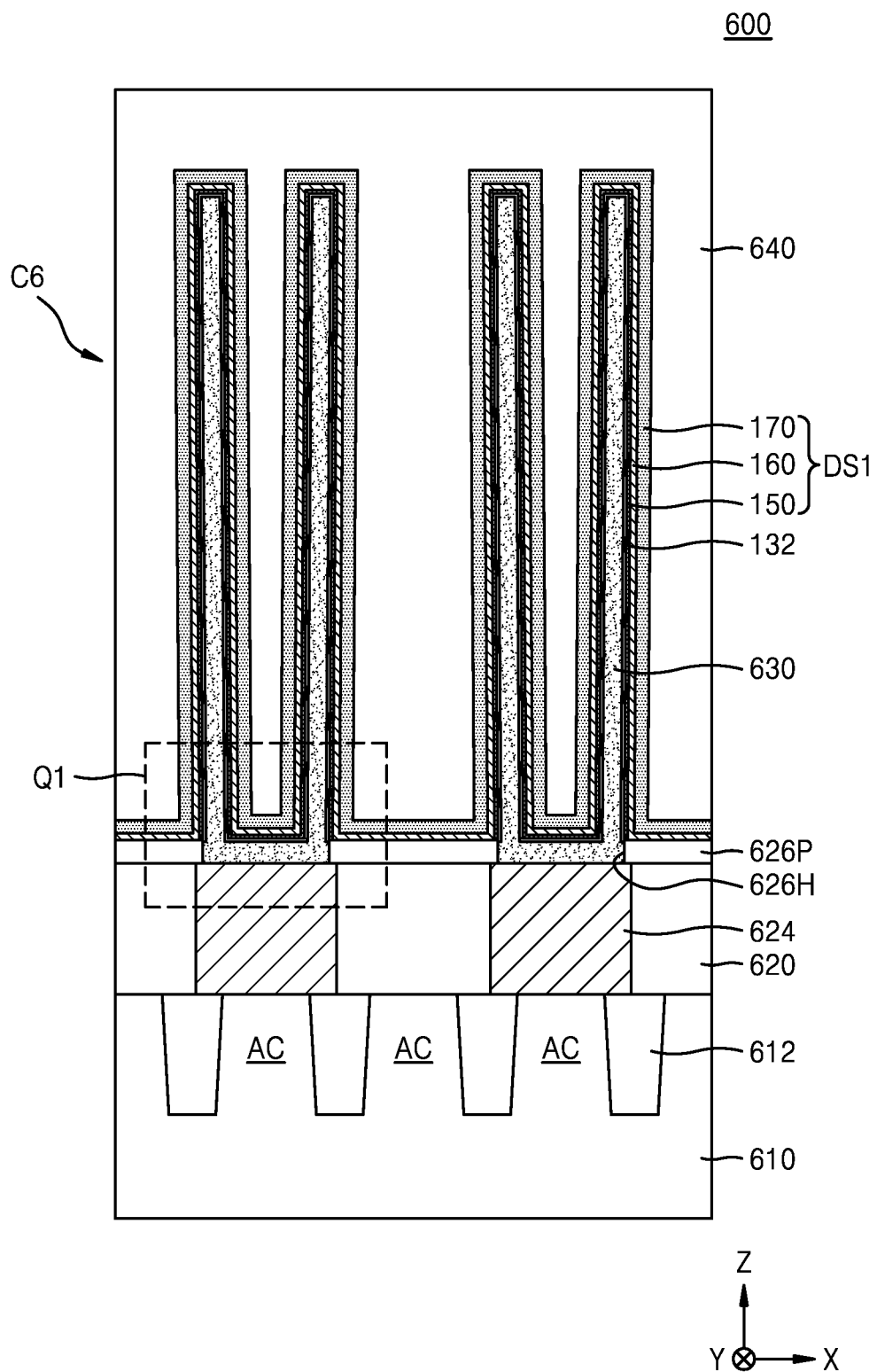
FIG. 6A is a cross-sectional view illustrating an integrated circuit device, according to an embodiment.
Figure 6B:
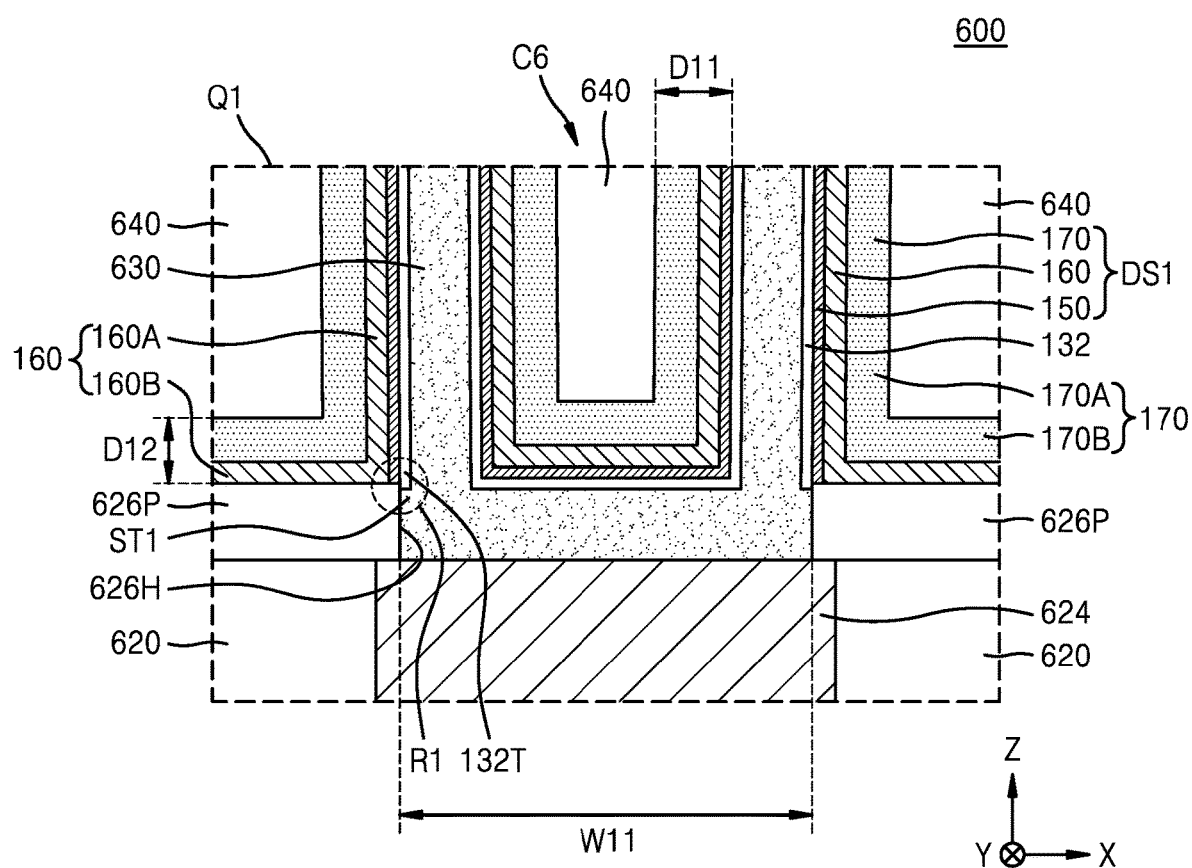
FIG. 6B is an enlarged cross-sectional view of a partial area of FIG. 6A.

FIG. 6A is a cross-sectional view illustrating an integrated circuit device 600, according to an embodiment, and FIG. 6B is an enlarged cross-sectional view of a partial area indicated by "Q1" of FIG. 6A. In FIGS. 6A and 6B, the same reference numerals as in FIG. 1 respectively denote the same members, and detailed descriptions thereof will be omitted.

Referring to FIGS. 6A and 6B, the integrated circuit device 600 includes a substrate 610 and an interlayer dielectric 620 on the substrate 610, the substrate 610 including a plurality of active regions AC. A plurality of conductive regions 624 may be connected to the plurality of active regions AC through the interlayer dielectric 620.

The substrate 610 has a substantially identical configuration to the substrate 110 described with reference to FIG. 1. In the substrate 610, the plurality of active regions AC may be defined by a plurality of device isolation regions 612. Each of the plurality of device isolation regions 612 may include an oxide film, a nitride film, or a combination thereof. The interlayer dielectric 620 may include a silicon oxide film. Each of the plurality of conductive regions 624 may include polysilicon, a metal, a conductive metal nitride, a metal silicide, or a combination thereof.

An insulating pattern 626P having a plurality of openings 626H may be formed on the interlayer dielectric 620 and the plurality of conductive regions 624. The insulating pattern 626P may include silicon nitride, silicon oxynitride, or a combination thereof.

A corresponding plurality of capacitors C6 may be respectively formed on the plurality of conductive regions 624. The plurality of capacitors C6 may include a plurality of bottom electrodes 630 and a top electrode 640. The plurality of capacitors C6 may share one top electrode 640. Each of the plurality of bottom electrodes 630 may have a cylindrical or cup shape having a closed bottom portion that faces the substrate 610. More detailed descriptions of the plurality of bottom electrodes 630 and the top electrode 640 are substantially identical to the descriptions of the bottom electrode 130 and the top electrode 140, which have been given with reference to FIG. 1.

Each of the plurality of capacitors C6 may further include the buffer layer 132 and the dielectric structure DS1, which are arranged between each bottom electrode 630 and the top electrode 640. The dielectric structure DS1 may include the crystallization induction film 150, the first dielectric film 160, and the second dielectric film 170.

Each of the buffer layer 132 and the crystallization induction film 150 may be arranged on the insulating pattern 626P to cover a surface of each bottom electrode 630, whereas portions of a top surface of the insulating pattern 626P spaced apart from each bottom electrode 630 may not be covered by each of the buffer layer 132 and the crystallization induction film 150. Thus, each of the buffer layer 132 and the crystallization induction film 150 may be formed in the manner of one-to-one correspondence with each bottom electrode 630 and may not be arranged in a region between two adjacent bottom electrodes 630.

Each of the first dielectric film 160 and the second dielectric film 170 may consecutively extend over the substrate 610 to cover the surface of each of the plurality of bottom electrodes 630 as well as the top surface of the insulating pattern 626P between the plurality of bottom electrodes 630. Thus, each of the first dielectric film 160 and the second dielectric film 170 may include portions that oppose the respective plurality of bottom electrodes 630 and portions that oppose the substrate 610 while being apart from the respective plurality of bottom electrodes 630 in a horizontal direction (X direction or Y direction).

Referring to FIG. 6B, first dielectric film 160 may include a first local region 160A, which opposes the plurality of bottom electrodes 630 with the buffer layer 132 and the crystallization induction film 150 between the first local region 160A and the plurality of bottom electrodes 630. As illustrated in FIG. 6B, the first local region 160A is disposed parallel to and in contact with the crystallization induction film 150. The first dielectric film 160 may also include a second local region 160B, which is integrally connected to the first local region 160A and opposes the substrate 610, the interlayer dielectric 620, and the insulating pattern 626P while being disposed apart from the crystallization induction film 150. As illustrated in FIG. 6B, the second local region 160B is disposed at a distal end of the first dielectric film 160 that is perpendicular to the crystallization induction film 150, and the second local region 160B does not contact the crystallization induction film 150 owing to the presence of the first local region 160A. The first local region 160A of the first dielectric film 160 may contact the crystallization induction film 150. Although each of the buffer layer 132 and the crystallization induction film 150 may be arranged between each bottom electrode 630 and the first local region 160A of the first dielectric film 160, each of the buffer layer 132 and the crystallization induction film 150 may not be arranged between the substrate 610 and the second local region 160B of the first dielectric film 160.

The second dielectric film 170 may include a first local region 170A, which opposes the plurality of bottom electrodes 630 with the buffer layer 132, the crystallization induction film 150, and the first dielectric film 160 between the first local region 170A and the plurality of bottom electrodes 630, and a second local region 170B, which is integrally connected to the first local region 170A and opposes the substrate 610, the interlayer dielectric 620, and the insulating pattern 626P while being disposed apart from the crystallization induction film 150. The first local region 170A of the second dielectric film 170 may contact the first local region 160A of the first dielectric film 160.

A first portion of the dielectric structure DS1, which is arranged between each bottom electrode 630 and the top electrode 640, may have a first thickness D11, and a second portion of the dielectric structure DS1, which is not arranged between each bottom electrode 630 and the top electrode 640 and includes the second local region 160B of the first dielectric film 160 and the second local region 170B of the second dielectric film 170, may have a second thickness D12 that is less than the first thickness D11. A difference between the first thickness D11 and the second thickness D12 may correspond to the thickness TH1 (see FIG. 1) of the crystallization induction film 150.

As shown in a region marked by a dashed line R1, a step ST1 may be formed at an outer wall of each bottom electrode 630, the outer wall being adjacent to an opening 626H of the insulating pattern 626P. A horizontal-direction (for example, X-direction) width W11 of a portion of each bottom electrode 630, which fills the opening 626H of the insulating pattern 626P, may decrease past the step ST1 in a direction away from the substrate 610. That is, the horizontal-direction width W11 of the portion of each bottom electrode 630, which is disposed nearer to the interlayer dielectric 620 than the step ST1, may be greater than a width of a portion of each bottom electrode 630, which is disposed farther from the interlayer dielectric 620 at least at the position of the step ST1 in the direction from the bottom electrode 630 to the top electrode 640.

An end 132T of the buffer layer 132 between each bottom electrode 630 and the dielectric structure DS1 may contact the step ST1 of each bottom electrode 630. The end 132T of the buffer layer 132 may be located closer to a center of each bottom electrode 630 in a horizontal direction than an inner wall of the opening 626H of the insulating pattern 626P.

In the integrated circuit device 600 described with reference to FIGS. 6A and 6B, the dielectric structure DS1 constituting the plurality of capacitors C6 includes the crystallization induction film 150, the first dielectric film 160, and the second dielectric film 170, which are sequentially stacked over each bottom electrode 630, the bottom surface of the first dielectric film 160 contacts the crystallization induction film 150, and the top surface of the first dielectric film 160 contacts the second dielectric film 170. Therefore, the crystallization induction film 150 may provide surface stress to the bottom surface of the first dielectric film 160 such that the first dielectric film 160 has a tetragonal crystal phase, and the second dielectric film 170 may provide surface stress to the top surface of the first dielectric film 160 such that the first dielectric film 160 has a tetragonal crystal phase. As a result, the first dielectric film 160 may maintain a crystal-phase structure favorable for providing a high dielectric constant, and each of the plurality of capacitors C6 may provide relatively high capacitance while suppressing the generation of leakage current therefrom.

Figure 7A:
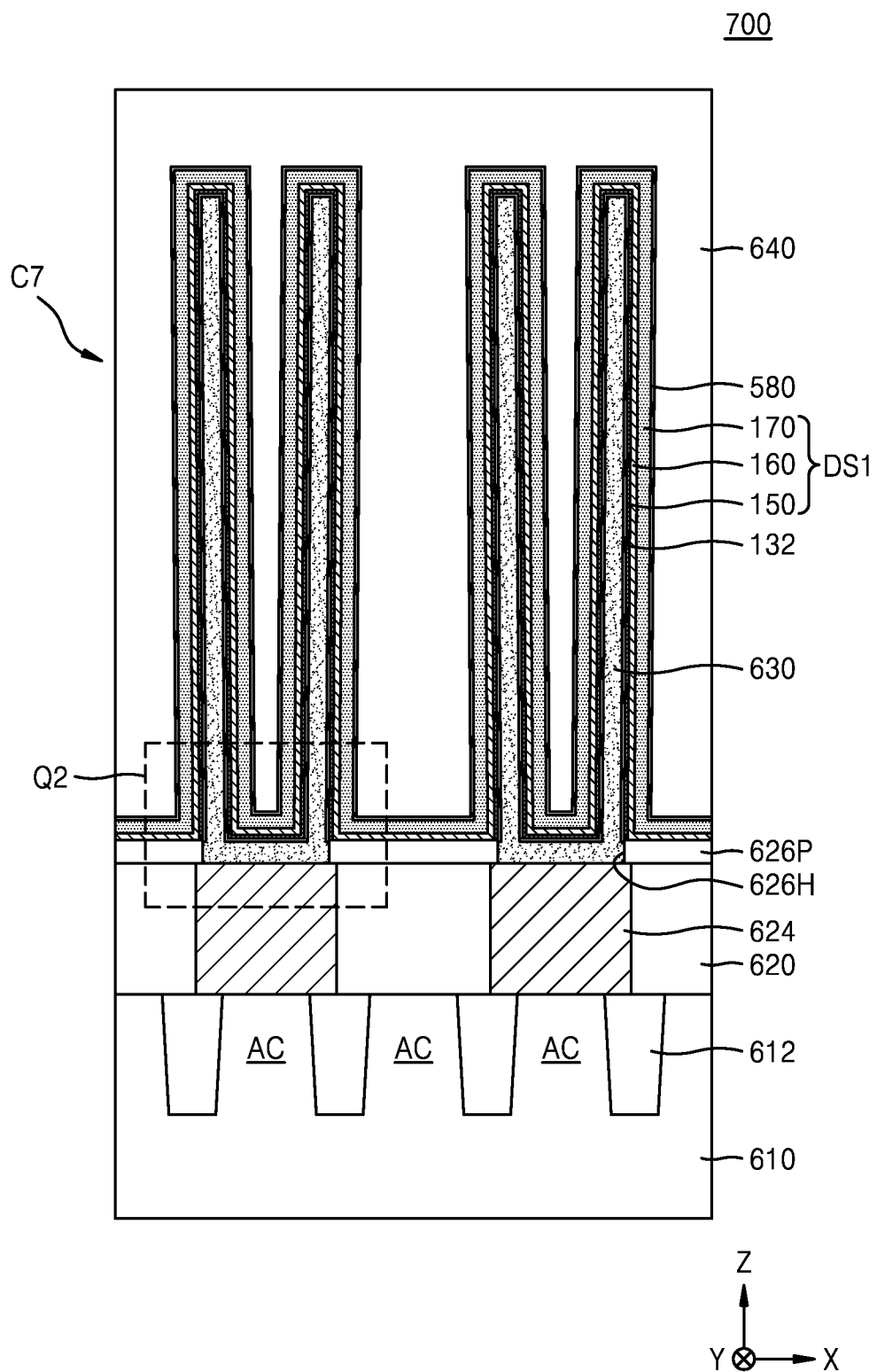
FIG. 7A is a cross-sectional view illustrating an integrated circuit device, according to an embodiment.
Figure 7B:
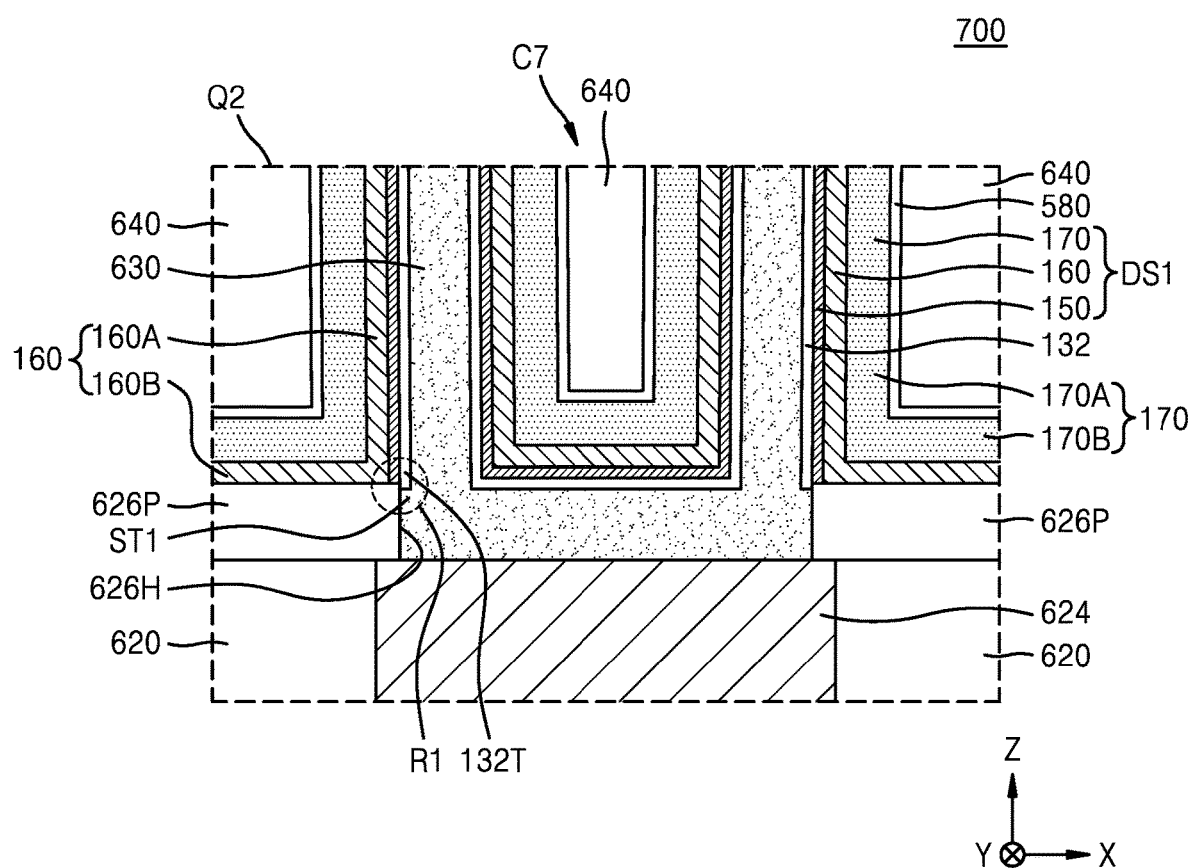
FIG. 7B is an enlarged cross-sectional view of a partial area of FIG. 7A.

FIG. 7A is a cross-sectional view illustrating an integrated circuit device 700, according to an embodiment, and FIG. 7B is an enlarged cross-sectional view of a partial area indicated by "Q2" of FIG. 7A. In FIGS. 7A and 7B, the same reference numerals as in FIGS. 1 to 6B respectively denote the same members, and detailed descriptions thereof will be omitted.

Referring to FIGS. 7A and 7B, the integrated circuit device 700 may have a substantially identical configuration to the integrated circuit device 600 described with reference to FIGS. 6A and 6B and may provide substantially identical effects thereto. However, a plurality of capacitors C7 included in the integrated circuit device 700 further include the interfacial film 580 disposed between the dielectric structure DS1 and the top electrode 640. The interfacial film 580 functions as a barrier preventing diffusion of oxygen from the dielectric structure DS1 toward the top electrode 640, whereby an increase in resistance of the top electrode 640 may be suppressed.

Figure 8A:
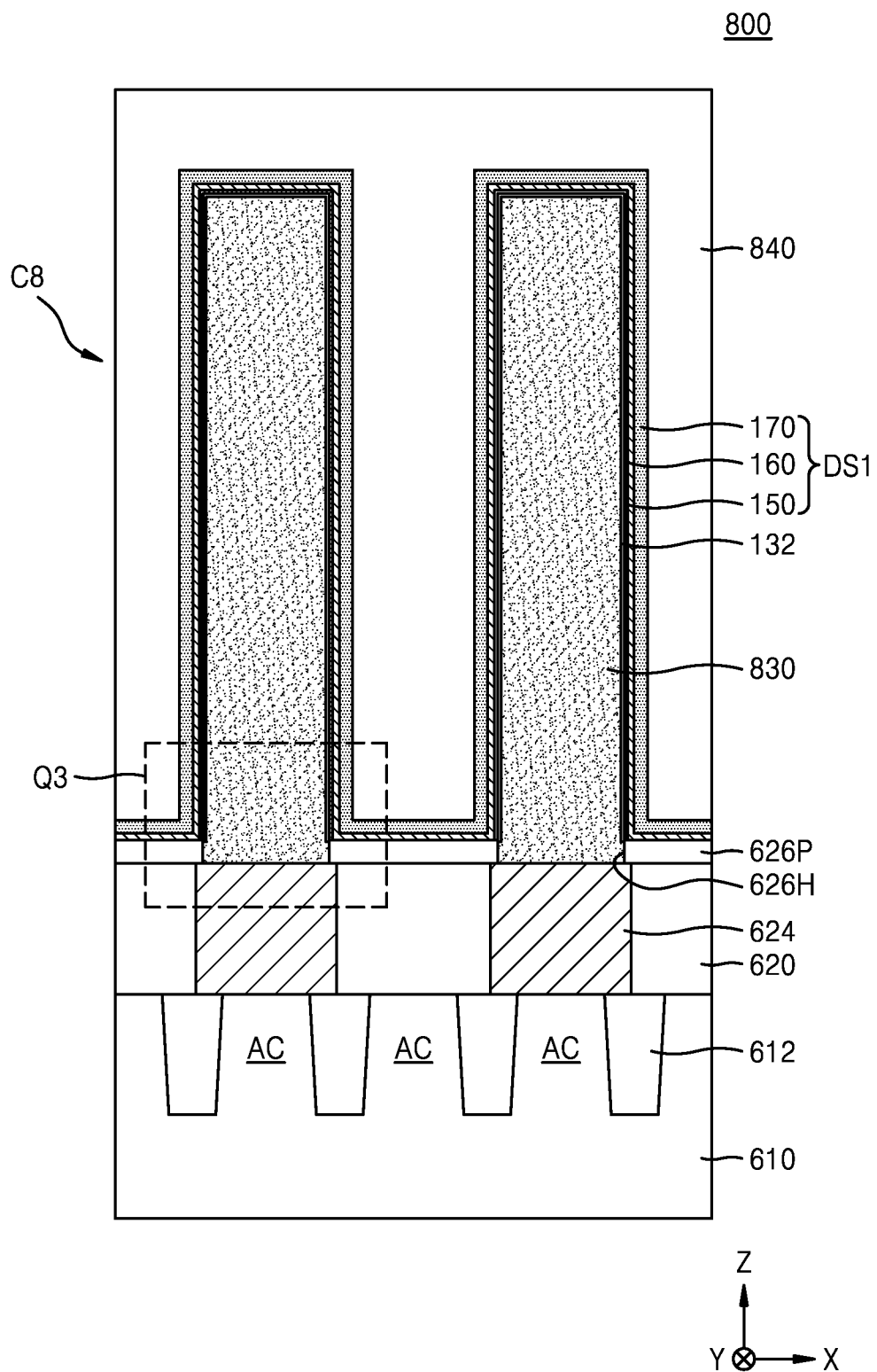
FIG. 8A is a cross-sectional view illustrating an integrated circuit device, according to an embodiment.

FIG. 8A is a cross-sectional view illustrating an integrated circuit device 800, according to an embodiment, and FIG.

Figure 8B:
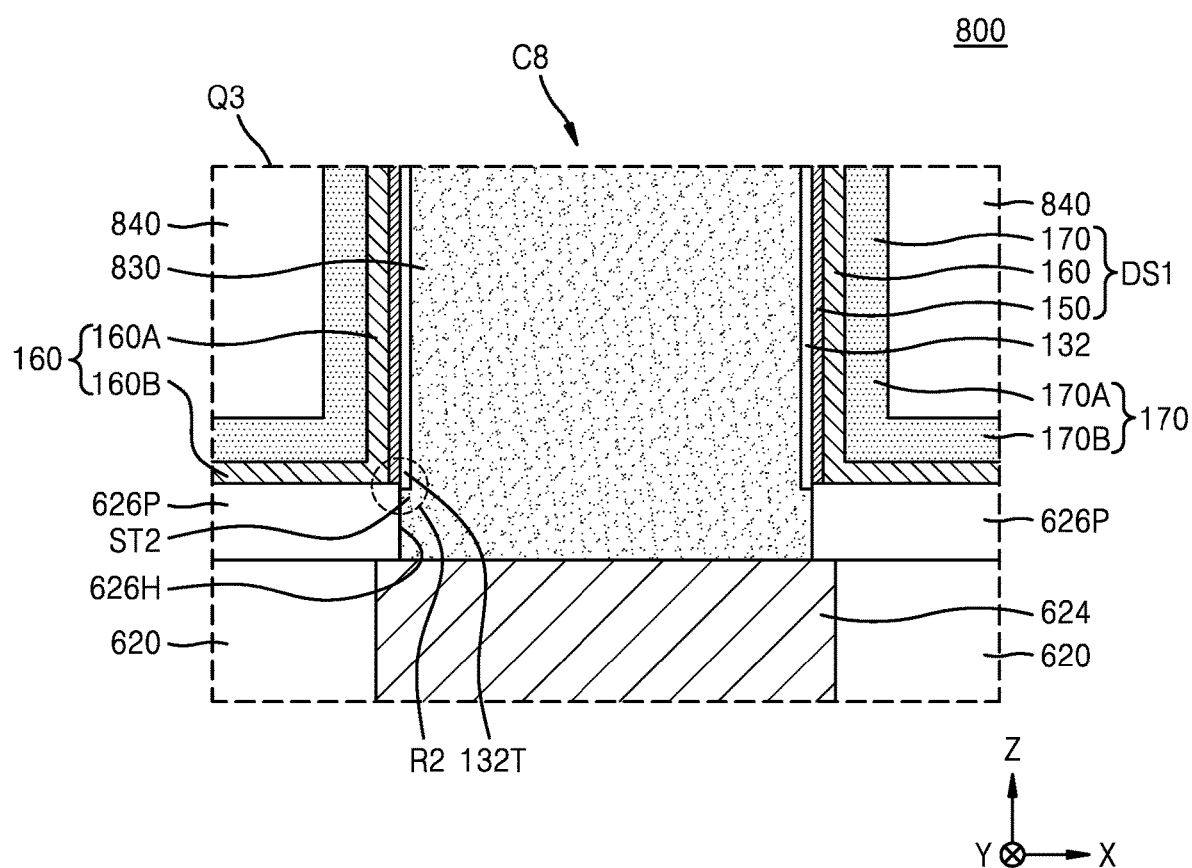
FIG. 8B is an enlarged cross-sectional view of a partial area of FIG. 8A.

8B is an enlarged cross-sectional view of a partial area indicated by "Q3" of FIG. 8A. In FIGS. 8A and 8B, the same reference numerals as in FIGS. 1 to 6B respectively denote the same members, and detailed descriptions thereof will be omitted.

Referring to FIGS. 8A and 8B, the integrated circuit device 800 may have a substantially identical configuration to the integrated circuit device 600 described with reference to FIGS. 6A and 6B and may provide substantially identical effects thereto. However, a plurality of capacitors C8 included in the integrated circuit device 800 may include a plurality of bottom electrodes 830 and a top electrode 840. The plurality of capacitors C8 may share one top electrode 840. Each of the plurality of capacitors C8 may have a pillar shape. More detailed descriptions of the plurality of bottom electrodes 830 and the top electrode 840 are substantially identical to the descriptions of the bottom electrode 130 and the top electrode 140, which have been given with reference to FIG. 1.

Each of the plurality of capacitors C8 may include the buffer layer 132 and the dielectric structure DS1, which are arranged between each bottom electrode 830 and the top electrode 840. The dielectric structure DS1 may include the crystallization induction film 150, the first dielectric film 160, and the second dielectric film 170.

Each of the buffer layer 132 and the crystallization induction film 150 may be arranged on the insulating pattern 626P to cover a surface of each bottom electrode 830, whereas portions of a top surface of the insulating pattern 626P disposed apart from each bottom electrode 830 may not be covered by each of the buffer layer 132 and the crystallization induction film 150. Thus, each of the buffer layer 132 and the crystallization induction film 150 may be formed in the manner of one-to-one correspondence with each bottom electrode 830 and may not be arranged in a region between two adjacent bottom electrodes 830.

The first dielectric film 160 may include the first local region 160A, which opposes the plurality of bottom electrodes 830 while the buffer layer 132 and the crystallization induction film 150 are between the first local region 160A and the plurality of bottom electrodes 830, and the second local region 160B, which is integrally connected to the first local region 160A and opposes the substrate 610, the interlayer dielectric 620, and the insulating pattern 626P while being apart from the crystallization induction film 150. Although each of the buffer layer 132 and the crystallization induction film 150 may be arranged between each bottom electrode 830 and the first local region 160A of the first dielectric film 160, each of the buffer layer 132 and the crystallization induction film 150 may not be arranged between the substrate 610 and the second local region 160B of the first dielectric film 160.

The second dielectric film 170 may include the first local region 170A, which opposes the plurality of bottom electrodes 830 with the buffer layer 132, the crystallization induction film 150, and the first dielectric film 160 disposed between the first local region 170A and the plurality of bottom electrodes 830, and the second local region 170B, which is integrally connected to the first local region 170A and opposes the substrate 610, the interlayer dielectric 620, and the insulating pattern 626P while being disposed apart from the crystallization induction film 150.

As shown in a region marked by a dashed line R2, a step ST2 may be formed at an outer wall of each bottom electrode 830, the outer wall being adjacent to the opening 626H of the insulating pattern 626P. A horizontal-direction (for example, X-direction) width of a portion of each bottom electrode 830, which fills the opening 626H of the insulating pattern 626P, may decrease past the step ST2 in the direction away from the substrate 610. That is, the horizontal-direction width of the portion of each bottom electrode 830, which is disposed nearer to the interlayer dielectric 620 than the step ST2, may be greater than a width of a portion of each bottom electrode 830, which is disposed farther from the interlayer dielectric 620 at least at the position of the step ST2.

The end 132T of the buffer layer 132 between each bottom electrode 830 and the dielectric structure DS1 may contact the step ST2 of each bottom electrode 830. The end 132T of the buffer layer 132 may be located closer to a center of each bottom electrode 830 in the horizontal direction than the inner wall of the opening 626H of the insulating pattern 626P.

Figure 9A:
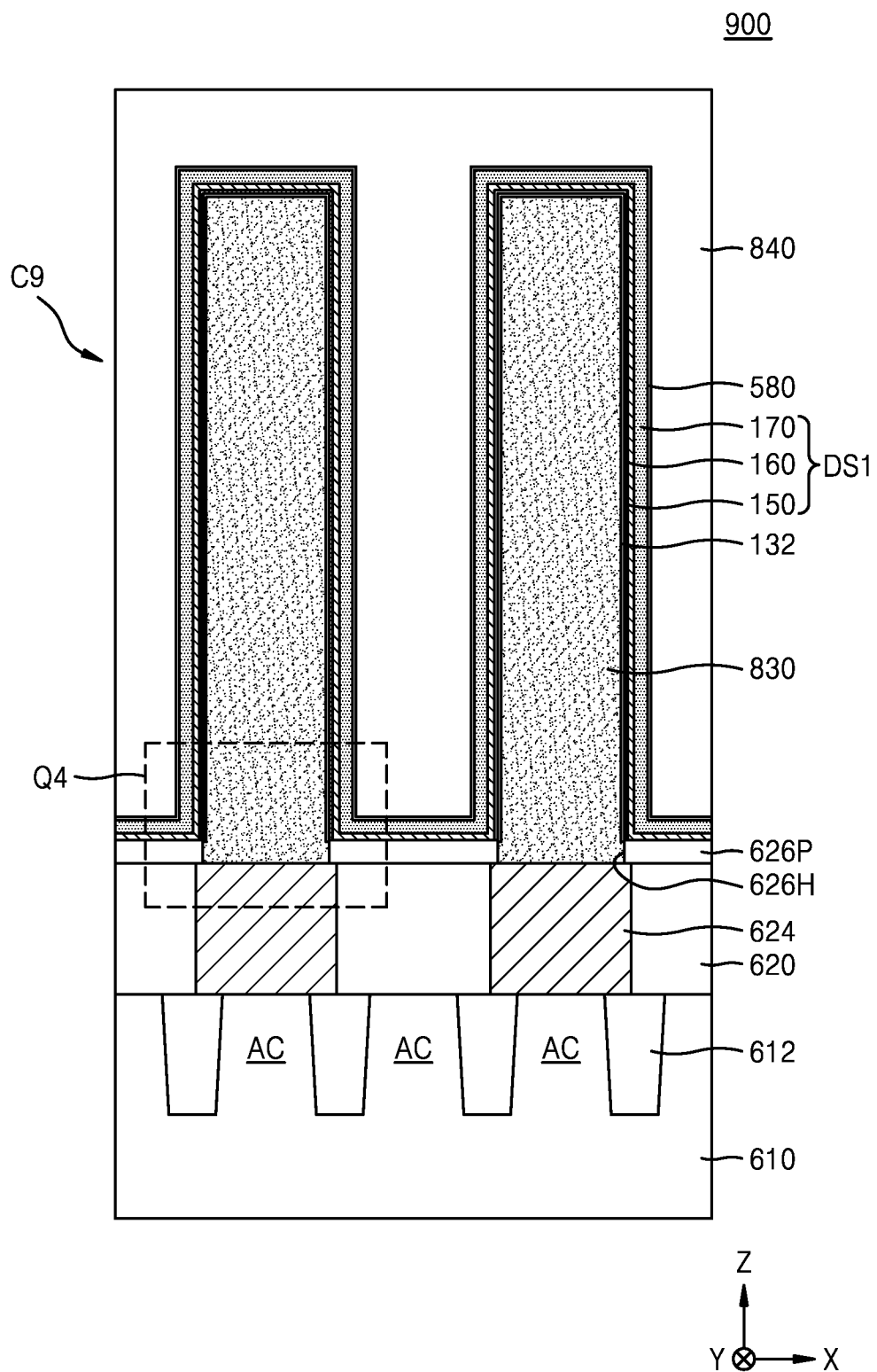
FIG. 9A is a cross-sectional view illustrating an integrated circuit device, according to an embodiment.
Figure 9B:
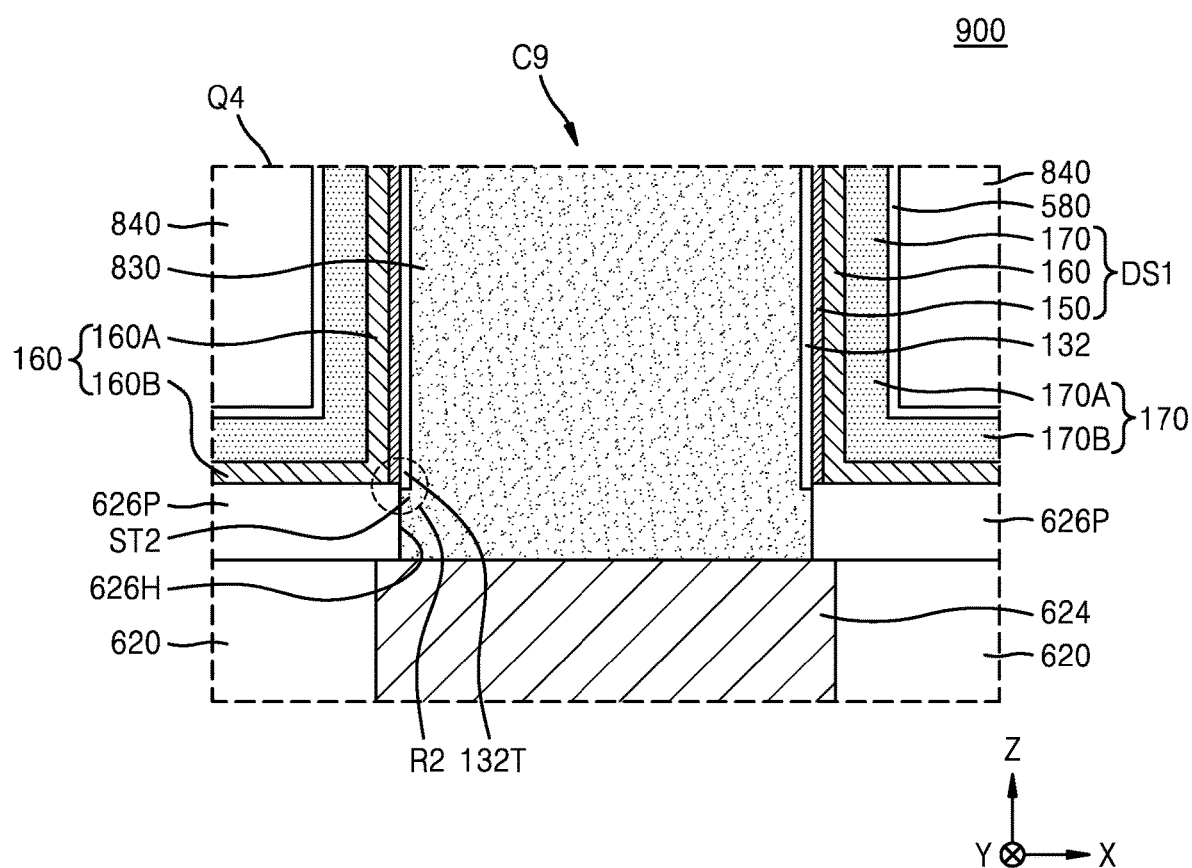
FIG. 9B is an enlarged cross-sectional view of a partial area of FIG. 9A.

FIG. 9A is a cross-sectional view illustrating an integrated circuit device 900, according to an embodiment, and FIG. 9B is an enlarged cross-sectional view of a partial area indicated by "Q4" of FIG. 9A. In FIGS. 9A and 9B, the same reference numerals as in FIGS. 1 to 8B respectively denote the same members, and detailed descriptions thereof will be omitted.

Referring to FIGS. 9A and 9B, the integrated circuit device 900 may have a substantially identical configuration to the integrated circuit device 800 described with reference to FIGS. 8A and 8B and may provide substantially identical effects thereto. However, a plurality of capacitors C9 included in the integrated circuit device 900 further include the interfacial film 580 between the dielectric structure DS1 and the top electrode 840. The interfacial film 580 functions as a barrier preventing diffusion of oxygen from the dielectric structure DS1 toward the top electrode 840, whereby an increase in resistance of the top electrode 840 may be suppressed.

Although example structures of the integrated circuit devices 600, 700, 800, and 900, each including the dielectric structure DS1, have been described with reference to FIGS. 6A to 9B, various changes and modifications may be made from the configurations shown in FIGS. 6A to 9B without departing from the spirit and scope of the disclosure. For example, each of the integrated circuit devices 600, 700, 800, and 900 may include, instead of the dielectric structure DS1, the dielectric structure DS2, DS3, DS4A, or DS4B shown in FIG. 2, 3, 4A, or 4B, or a dielectric structure having a structure variously changed and modified therefrom without departing from the spirit and scope of the disclosure.

FIGS. 10A to 10I are cross-sectional views illustrating sequential processes of a method of fabricating an integrated circuit device, according to an embodiment. An example method of fabricating the integrated circuit device shown in FIGS. 6A and 6B will be described with reference to FIGS. 10A to 10I.

Figure 10A:
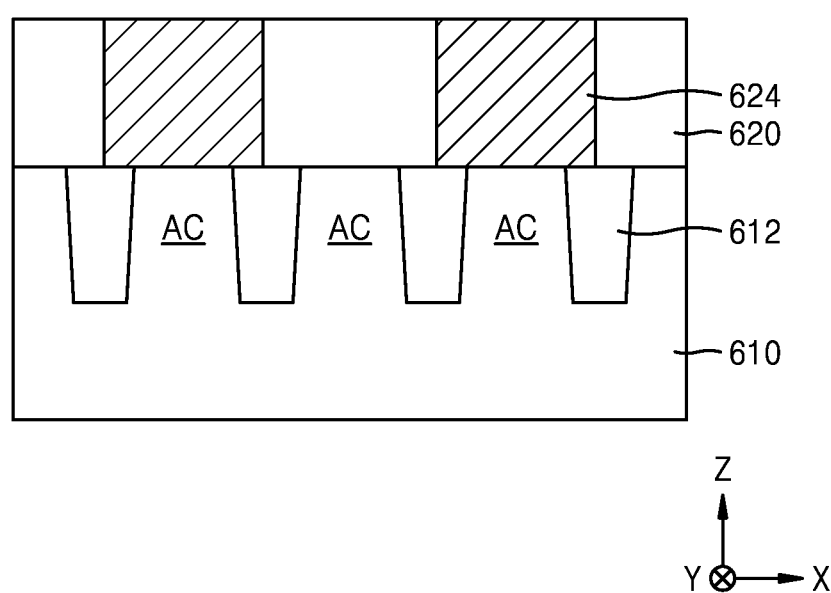
FIGS. 10A, 10B, 10C, 10D, 10E, 10F, 10G, 10H, and 10I are cross-sectional views illustrating sequential processes of a method of fabricating an integrated circuit device, according to an embodiment.

Referring to FIG. 10A, the interlayer dielectric 620 is formed on the substrate 610 in which the plurality of active regions AC are defined by the device isolation region 612, followed by forming the plurality of conductive regions 624, which are connected to the plurality of active regions AC through the interlayer dielectric 620.

Figure 10B:
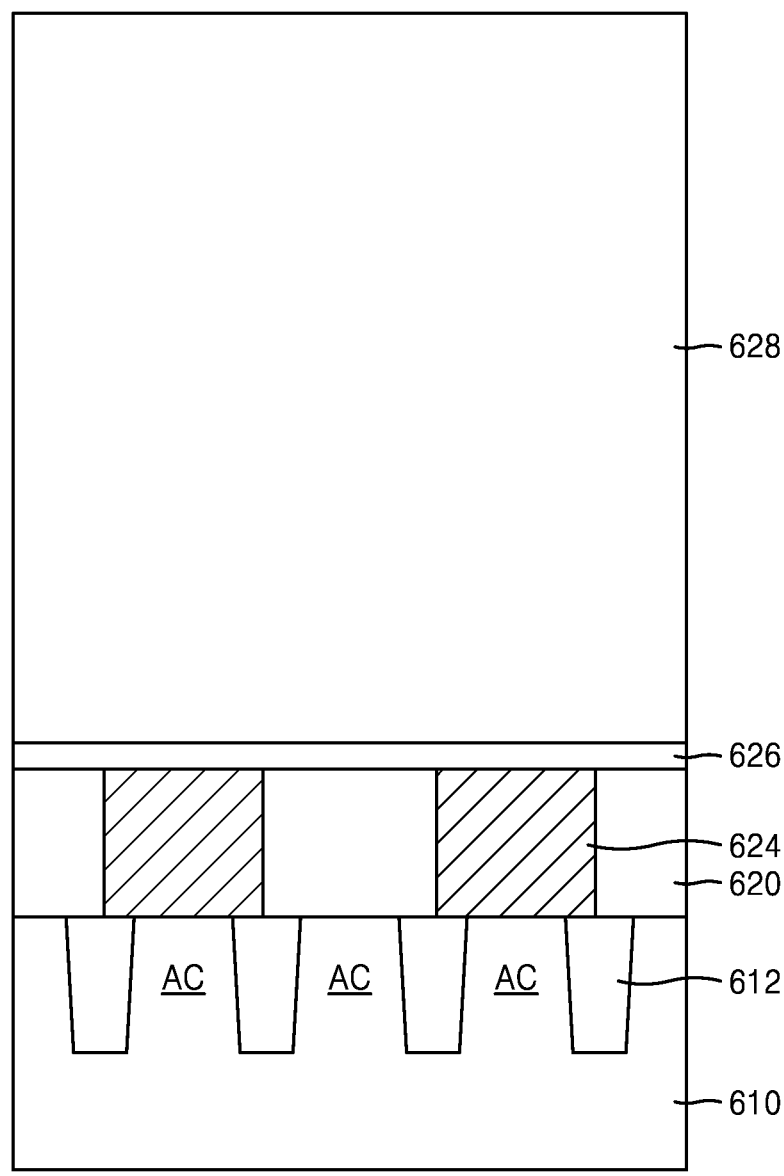

Referring to FIG. 10B, an insulating layer 626 and a mold film 628 are sequentially formed on the interlayer dielectric 620 and the plurality of conductive regions 624.

The insulating layer 626 may be used as an etch stop layer. The insulating layer 626 may include an insulating material having etch selectivity with respect to the interlayer dielectric 620 and the mold film 628. In some embodiments, the insulating layer 626 may include silicon nitride, silicon oxynitride, or a combination thereof.

The mold film 628 may include an oxide film. In some embodiments, the mold film 628 may include at least one support film. The at least one support film may include a material having etch selectivity with respect to the mold film 628.

Figure 10C:
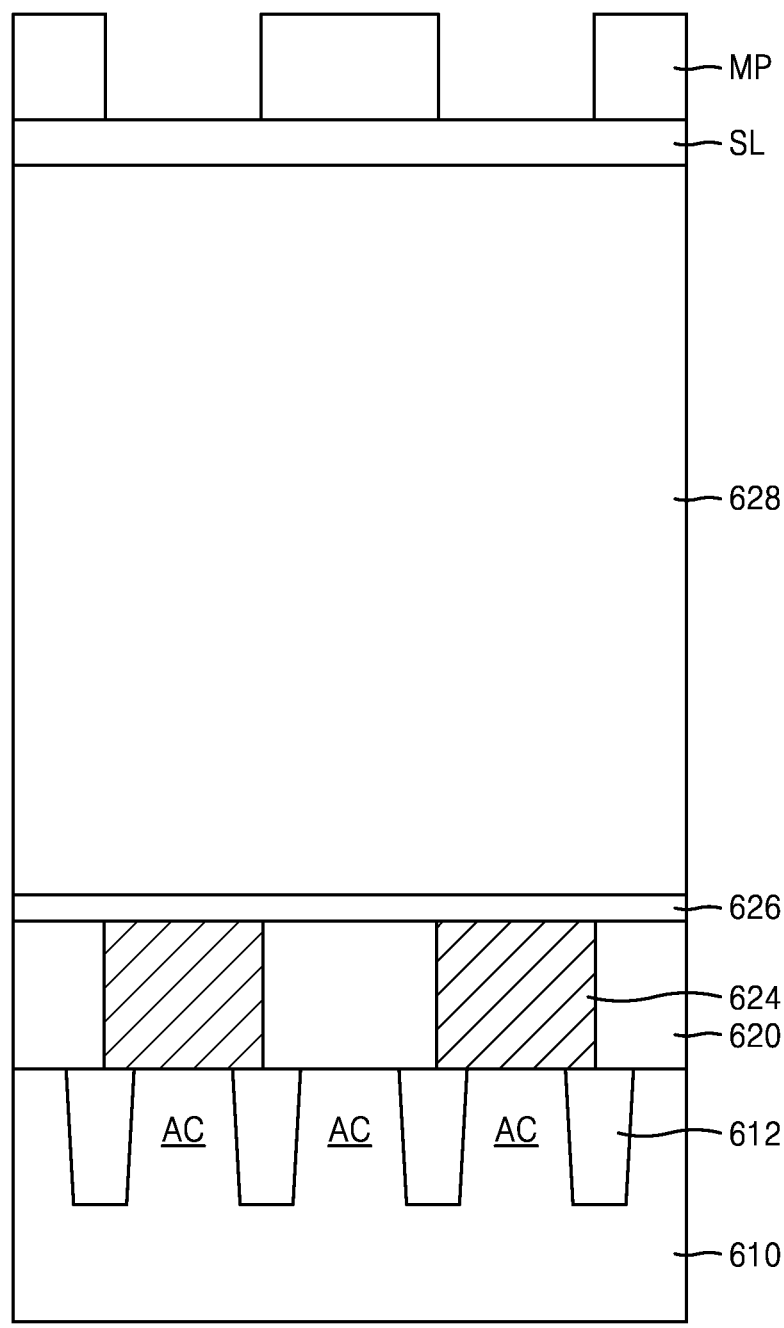

Referring to FIG. 10C, a sacrificial film SL and a mask pattern MP are sequentially formed on the mold film 628.

The sacrificial film SL may include an oxide film. The mask pattern MP may include an oxide film, a nitride film, a polysilicon film, a photoresist film, or a combination thereof. A region in which a bottom electrode of a capacitor is to be formed may be defined by the mask pattern MP.

Figure 10D:
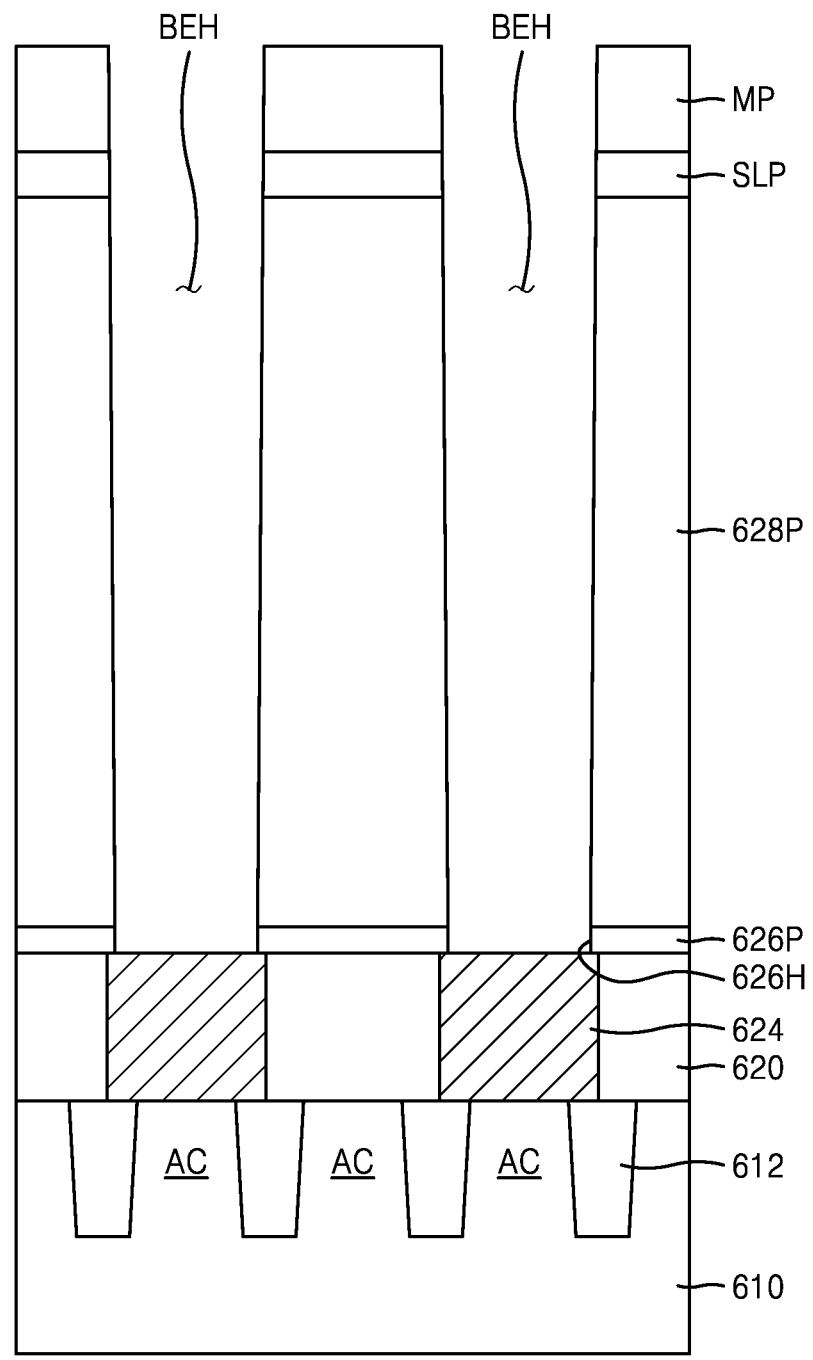

Referring to FIG. 10D, in a result product of FIG. 10C, the sacrificial film SL, the mold film 628, and the insulating layer 626 are anisotropically etched by using the mask pattern MP as an etch mask and using the insulating layer 626 as an etch stop layer, thereby forming a sacrificial pattern SLP, a mold pattern 628P, and the insulating pattern 626P, which define a plurality of holes BEH. The plurality of openings 626H may be formed in the insulating pattern 626P, the plurality of openings 626H exposing the plurality of conductive regions 624.

Figure 10E:
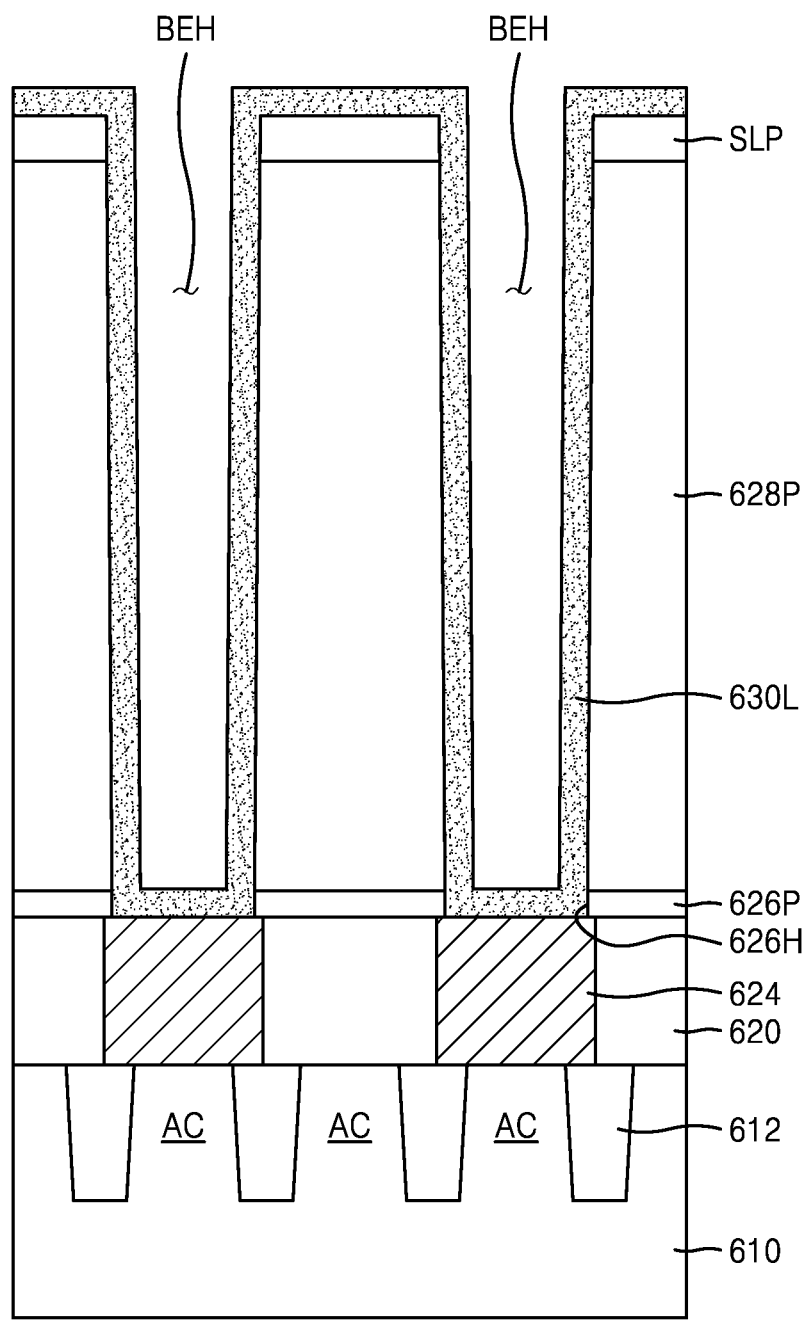

Referring to FIG. 10E, the mask pattern MP is removed from a result product of FIG. 10D, followed by forming a bottom electrode-forming conductive film 630L, which covers surfaces of the plurality of conductive regions 624, a surface of the insulating pattern 626P, and a surface of the sacrificial pattern SLP inside the respective plurality of holes BEH. The bottom electrode-forming conductive film 630L may conformally cover inner sidewalls of the plurality of holes BEH such that an inner space of each of the plurality of holes BEH may partially remain.

Descriptions of a constituent material of the bottom electrode-forming conductive film 630L are the same as the descriptions of the constituent material of the bottom electrode 130, which have been given with reference to FIG. 1. To form the bottom electrode-forming conductive film 630L, a chemical vapor deposition (CVD), metal organic CVD (MOCVD), or atomic layer deposition (ALD) process may be used.

Figure 10F:
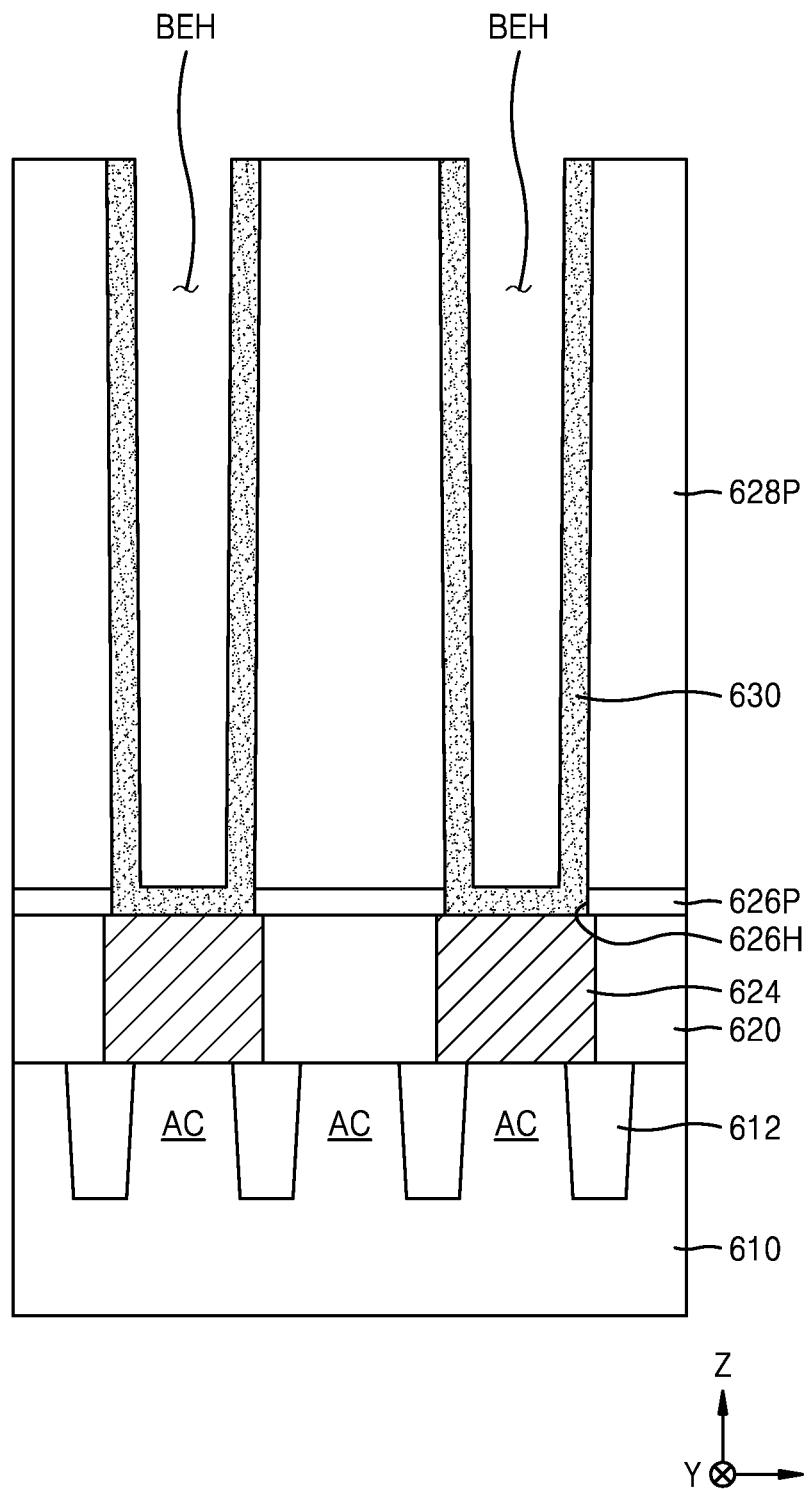

Referring to FIG. 10F, an upper portion of the bottom electrode-forming conductive film 630L is partially removed from a result product of FIG. 10E, thereby separating the bottom electrode-forming conductive film 630L into the plurality of bottom electrodes 630.

To form the plurality of bottom electrodes 630, the upper portion of the bottom electrode-forming conductive film 630L and the sacrificial pattern SLP (see FIG. 10E) may be removed by an etch-back process or a chemical mechanical polishing (CMP) process such that a top surface of the mold pattern 628P is exposed.

Figure 10G:
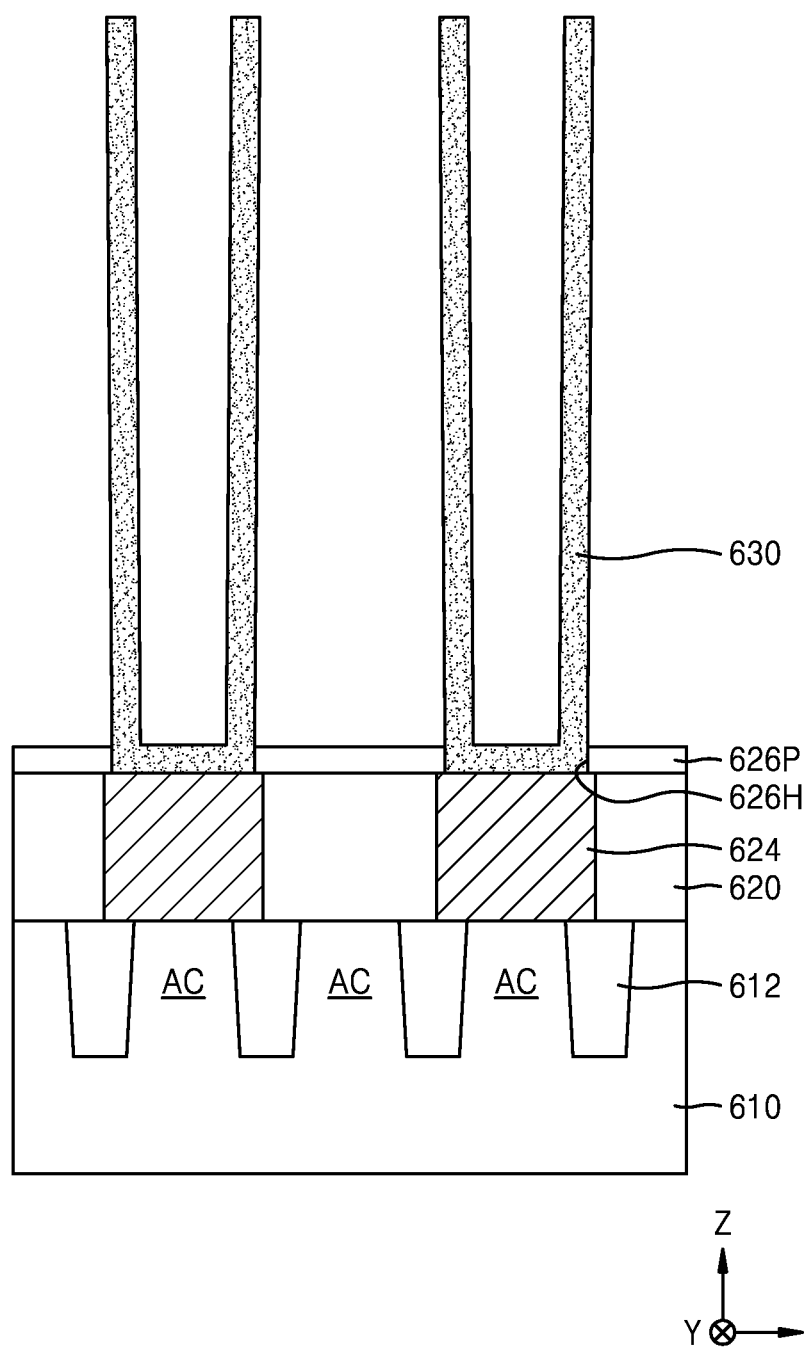

Referring to FIG. 10G, the mold pattern 628P is removed from a result product of FIG. 10F, thereby exposing outer surfaces of the plurality of bottom electrodes 630 and the top surface of the insulating pattern 626P, each of the plurality of bottom electrodes 630 having a cylindrical shape.

Figure 10H:
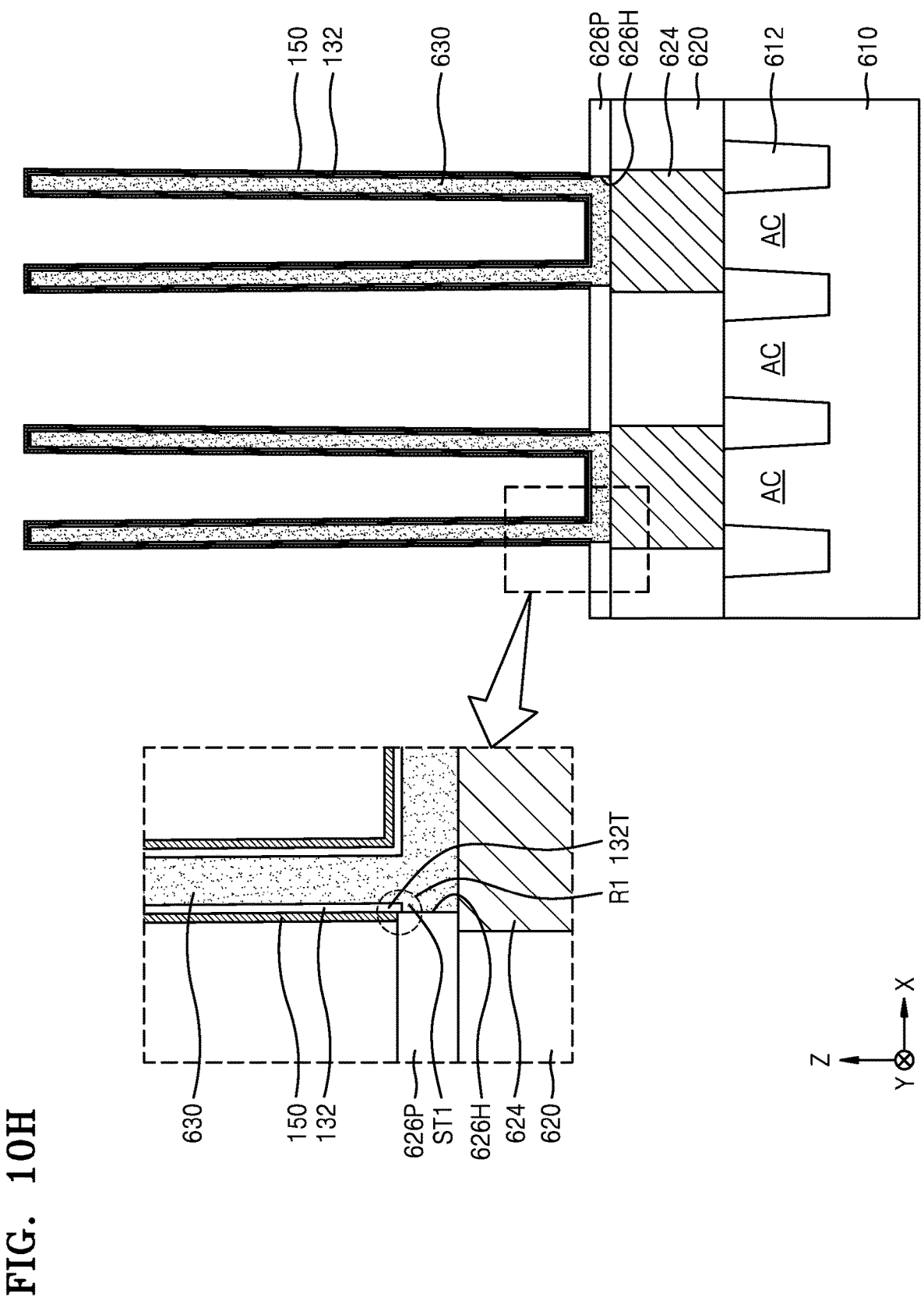

Referring to FIG. 10H, an exposed surface of each of the plurality of bottom electrodes 630 is oxidized, thereby forming the crystallization induction film 150 on the surface of each of the plurality of bottom electrodes 630. While the crystallization induction film 150 is formed, the buffer layer 132 may be formed between the crystallization induction film 150 and each of the plurality of bottom electrodes 630.

In some embodiments, to form the crystallization induction film 150, the plurality of bottom electrodes 630 may undergo a heat treatment at a temperature of about 100° C. to about 600° C. in an oxidation atmosphere. The heat treatment may be performed by a rapid thermal annealing (RTA) process, an annealing process, a plasma annealing process, or a combination thereof, without being limited thereto.

In some embodiments, to form the crystallization induction film 150, an oxidative reaction gas may be supplied to the exposed surface of each of the plurality of bottom electrodes 630. The oxidative reaction gas may include $O_2$, $O_3$, $H_2O$, $NO$, $NO_2$, $N_2O$, $CO_2$, $H_2O_2$, $HCOOH$, $CH_3COOH$, $(CH_3CO)_2O$, plasma $O_2$, remote plasma $O_2$, plasma $N_2O$, plasma $H_2O$, or a combination thereof, without being limited thereto.

The first metal included in the plurality of bottom electrodes 630 is oxidized by oxygen atoms obtained from the oxidative reaction gas supplied to the exposed surface of each of the plurality of bottom electrodes 630, whereby the crystallization induction film 150 including an oxide of the first metal may be formed. For more descriptions of the first metal, reference may be made to the descriptions thereof given with reference to FIG. 1. In the case where each of the plurality of bottom electrodes 630 includes a metal nitride film, while the crystallization induction film 150 is formed, the buffer layer 132 including the first metal, oxygen atoms, and nitrogen atoms may be formed on a portion of the surface of each of the plurality of bottom electrodes 630, the portion being adjacent to the crystallization induction film 150. The first metal and the nitrogen atoms included in the buffer layer 132 may be the first metal and the nitrogen atoms, which were included in each of the plurality of bottom electrodes 630 before the formation of the crystallization induction film 150. After the crystallization induction film 150 and the buffer layer 132 are formed, nitrogen atom content in the buffer layer 132 may gradually decrease with decreasing distance from the crystallization induction film 150.

As shown in a region marked by the dashed line R1 in FIG. 10H, after the crystallization induction film 150 and the buffer layer 132 are formed, the step ST1 may be formed at the outer wall of each bottom electrode 630, which is adjacent to the opening 626H of the insulating pattern 626P, and the end 132T of the buffer layer 132 may contact the step ST1 of each bottom electrode 630.

Figure 10I:
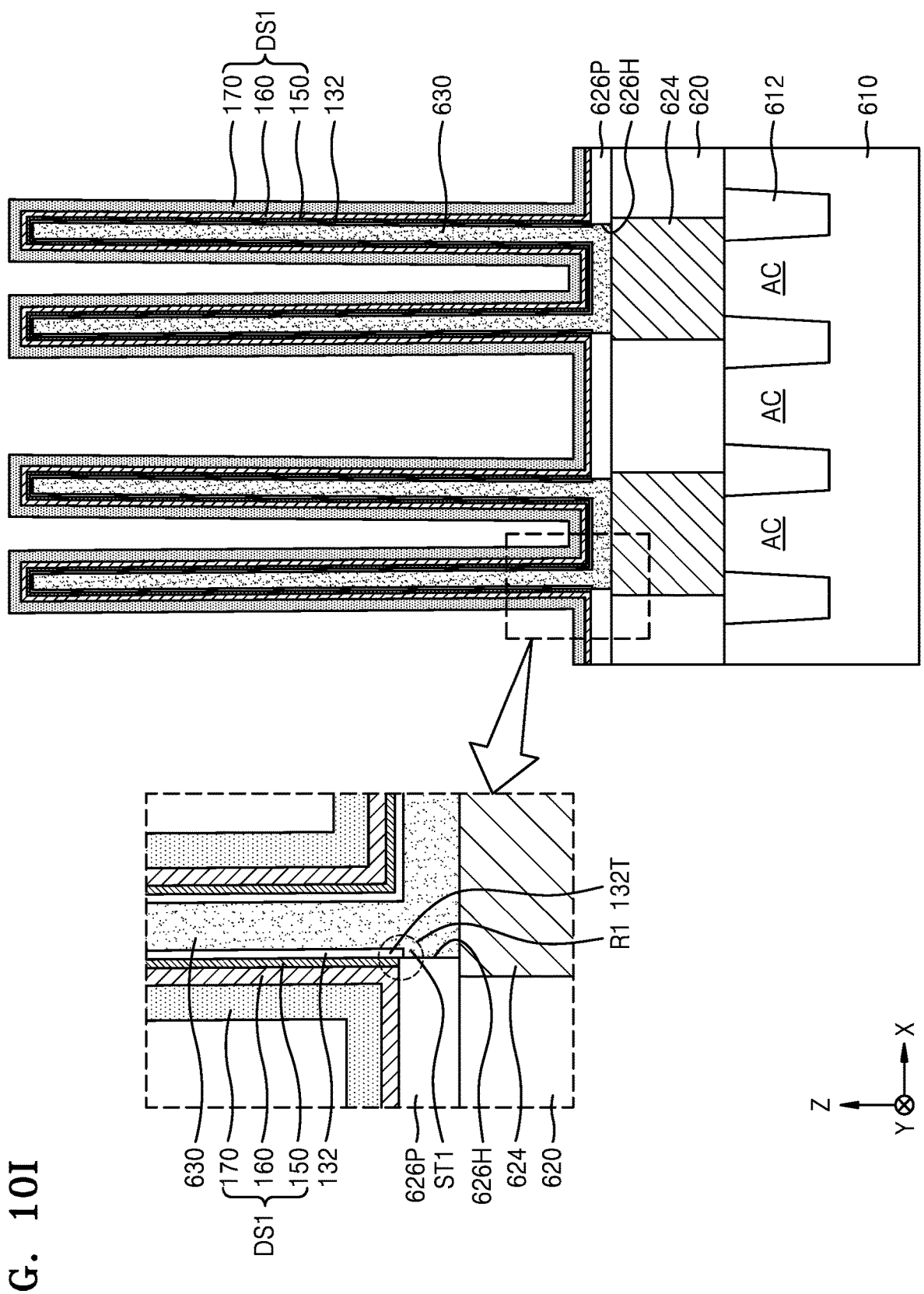

Referring to FIG. 10I, the first dielectric film 160 and the second dielectric film 170 are sequentially formed, on a result product of FIG. 10H, in which the crystallization induction film 150 and the buffer layer 132 are formed.

In some embodiments, to form the first dielectric film 160 and the second dielectric film 170, an atomic layer deposition (ALD) process may be used.

An ALD process for forming the first dielectric film 160 may be performed by the following example process. First, a precursor including the second metal may be supplied onto the substrate 610 in a reaction space while the crystallization induction film 150 of the substrate 610 is exposed, whereby a metal precursor layer including the second metal may be formed on the surface of the crystallization induction film 150 and the surface of the insulating pattern 626P. For more descriptions of the second metal, reference may be made to the descriptions thereof given with reference to FIG. 1.

The reaction space may be provided by a chamber for performing an ALD process. The precursor including the second metal may be supplied, in a vaporized state, onto the substrate 610. While the precursor including the second metal is supplied onto the substrate 610, an inside of the reaction space may be maintained at a first temperature selected from a range of about 100° C. to about 600° C., for example, at a temperature of about 150° C. to about 400° C. The precursor including the second metal is supplied, in a vaporized state, onto the substrate 610, whereby both a chemisorbed layer and a physisorbed layer of the precursor including the second metal may be formed on the surface of the crystallization induction film 150 and the surface of the insulating pattern 626P. Next, a purge gas may be supplied onto the substrate 610 while the inside of the reaction space is maintained at the first temperature, whereby unneeded by-products on the substrate 610 may be removed. Here, the physisorbed layer of the precursor remaining on the substrate 610 may also be removed. As the purge gas, for example, an inert gas such as Ar, He, or Ne, $N_2$ gas, or the like may be used.

Next, an oxidative reaction gas may be supplied onto the substrate 610, whereby a metal oxide film including a second metal oxide that is an oxide of the second metal may be formed from the chemisorbed layer of the precursor including the second metal. The oxidative reaction gas may include $O_2$, $O_3$, plasma $O_2$, $H_2O$, $NO_2$, NO, $N_2O$, $CO_2$, $H_2O_2$, HCOOH, $CH_3COOH$, $(CH_3CO)_2O$, or a combination thereof, without being limited thereto. Next, the purge gas may be supplied onto the substrate 610, whereby unneeded by-products on the substrate 610 may be removed.

Next, the ALD process described above may be repeated such that the first dielectric film 160 having a desired thickness is obtained.

In some embodiments, the first dielectric film 160 may include a $HfO_2$ film. Here, in the case where the crystallization induction film 150 includes a $TiO_2$ film having a rutile structure, the crystallization induction film 150 may provide surface stress such that the $HfO_2$ film constituting the first dielectric film 160 formed on the crystallization induction film 150 has a preferred orientation of a tetragonal phase, whereby the first dielectric film 160 contacting the crystallization induction film 150 may be crystallized in a tetragonal phase.

An ALD process for forming the second dielectric film 170 may be performed in a manner similar to the ALD process for forming the first dielectric film 160. However, instead of the precursor including the second metal, a precursor including a metal different from the first metal and the second metal may be used. In some embodiments, to form the second dielectric film 170, a precursor including Zr, Al, Nb, Ce, La, Ta, or Ti may be used.

The dielectric structure DS1 including the crystallization induction film 150, the first dielectric film 160, and the second dielectric film 170 may be obtained by forming the second dielectric film 170. In some embodiments, a result product, in which the dielectric structure DS1 is formed, may be annealed at a temperature of about 500° C. to about 1150° C.

Next, the top electrode 640 may be formed on the result product of FIG. 10I to cover the dielectric structure DS1, thereby fabricating the integrated circuit device 600 shown in FIGS. 6A and 6B. To form the top electrode 640, a chemical vapor deposition (CVD), metal organic chemical vapor-phase deposition (MOCVD), physical vapor deposition (PVD), or ALD process may be used.

To fabricate the integrated circuit device 700 shown in FIGS. 7A and 7B, the same method as described with reference to FIGS. 10A to 10I may be used. However, after processes are performed up to a process of forming the second dielectric film 170 according to the method described with reference to FIG. 10I, before the top electrode 640 is formed, a process of forming the interfacial film 580 may be further performed. To form the interfacial film 580, an ALD process may be used.

To fabricate the integrated circuit device 800 shown in FIGS. 8A and 8B, the same method as described with reference to FIGS. 10A to 10I may be used. However, in processes described with reference to FIGS. 10E and 10F, the plurality of bottom electrodes 830, each having a pillar shape, may be formed instead of forming the plurality of bottom electrodes 630, each having a cylindrical shape. Next, the buffer layer 132, the crystallization induction film 150, the first dielectric film 160, and the second dielectric film 170 may be formed on a result product in which the plurality of bottom electrodes 830 are formed in the manner as described with reference to FIGS. 10H and 10I, and then, the top electrode 840 may be formed to cover the dielectric structure DS1.

To fabricate the integrated circuit device 900 shown in FIGS. 9A and 9B, a method similar to the method of fabricating the integrated circuit device 800 shown in FIGS. 8A and 8B may be used. However, after processes are performed up to the process of forming the second dielectric film 170 according to the method described with reference to FIG. 10I, before the top electrode 640 is formed, the process of forming the interfacial film 580 may be further performed.

Heretofore, although example methods of fabricating the integrated circuit devices 600, 700, 800, and 900 shown in FIGS. 6A to 9B have been described with reference to FIGS. 10A to 10I, it will be understood by those skilled in the art that the integrated circuit devices 100, 200, 300, 400A, 400B, and 500 shown in FIGS. 1 to 5 or various integrated circuit devices having similar structures thereto may be fabricated from the descriptions given with reference to FIGS. 10A to 10I by applying various changes and modifications without departing from the spirit and scope of the disclosure.

While the disclosure has been particularly shown and described with reference to embodiments thereof, it will be understood that various changes in form and details may be made therein without departing from the spirit and scope of the following claims.

What is claimed is:

1. An integrated circuit device comprising:
   an electrode, the electrode comprising a first metal;
   a buffer layer disposed on the electrode, the buffer layer comprising the first metal, oxygen atoms, and nitrogen atoms; and
   a dielectric structure disposed on the buffer layer, wherein the dielectric structure comprises:
   a crystallization induction film disposed on the buffer layer, the crystallization induction film comprising a first metal oxide film, the first metal oxide film comprising the first metal; and
   a first dielectric film disposed on the crystallization induction film, the first dielectric film comprising a second metal oxide film, the second metal oxide film comprising a second metal.

2. The integrated circuit device according to claim 1, wherein the first metal comprises a transition metal or a post-transition metal.

3. The integrated circuit device according to claim 1, wherein a first thickness of the crystallization induction film is less than a second thickness of the first dielectric film.

4. The integrated circuit device according to claim 1, wherein the first dielectric film has a tetragonal phase.

5. The integrated circuit device according to claim 1, wherein a lattice mismatch between the first metal oxide film and the second metal oxide film is 15% or less.

6. The integrated circuit device according to claim 1, wherein the electrode comprises at least one of a metal film comprising the first metal, a metal oxide film comprising the first metal, a metal nitride film comprising the first metal, and a metal oxynitride film comprising the first metal.

7. The integrated circuit device according to claim 1, wherein the first dielectric film comprises:
 a first local region disposed on the crystallization induction film; and
 a second local region integrally connected to the first local region and disposed at a distal end of the first dielectric film apart from the crystallization induction film.

8. The integrated circuit device according to claim 1, wherein nitrogen atom content in the buffer layer varies in a thickness direction of the buffer layer.

9. The integrated circuit device according to claim 1, wherein the dielectric structure further comprises:
 a second dielectric film disposed on the first dielectric film, the second dielectric film having a second band gap that is greater than a first band gap of the first dielectric film.

10. The integrated circuit device according to claim 1, wherein the dielectric structure further comprises:
 a second dielectric film disposed on the first dielectric film, the second dielectric film having a second band gap that is greater than a first band gap of the first dielectric film; and
 a third dielectric film disposed on the second dielectric film, the third dielectric film having a third band gap that is greater than the second band gap.

11. An integrated circuit device comprising:
 a substrate;
 a bottom electrode disposed over the substrate, the bottom electrode comprising a first metal;
 a top electrode disposed over the bottom electrode;
 a dielectric structure disposed between the bottom electrode and the top electrode; and
 a buffer layer disposed between the bottom electrode and the dielectric structure, the buffer layer comprising the first metal, oxygen atoms, and nitrogen atoms,
 wherein the dielectric structure comprises:
  a crystallization induction film disposed on the buffer layer; and
  a first dielectric film disposed on the crystallization induction film, the first dielectric film comprising a second metal oxide film, the second metal oxide film comprising a second metal.

12. The integrated circuit device according to claim 11, wherein the first dielectric film comprises:
 a first local region disposed between the bottom electrode and the top electrode, the first local region disposed on the crystallization induction film; and
 a second local region integrally connected to the first local region and disposed at a distal end of the first dielectric film apart from the crystallization induction film.

13. The integrated circuit device according to claim 12, wherein the dielectric structure comprises:
 a first portion having a first thickness, the first portion being disposed between the bottom electrode and the top electrode; and
 a second portion having a second thickness that is less than the first thickness, the second portion comprising the second local region.

14. The integrated circuit device according to claim 11, wherein the dielectric structure further comprises a second dielectric film disposed on the first dielectric film, and
 wherein a second band gap of the second dielectric film is greater than a first band gap of the first dielectric film.

15. The integrated circuit device according to claim 11, wherein the dielectric structure further comprises:
 a composite dielectric film structure disposed on the first dielectric film, wherein the composite dielectric film structure comprises:
  at least one second dielectric film having a band gap greater than a band gap of the first dielectric film; and
  at least one third dielectric film having a band gap greater than the band gap of the at least one second dielectric film,
  wherein second dielectric films among the at least one second dielectric film are alternately stacked on the first dielectric film with third dielectric films of the at least one third dielectric film.

16. The integrated circuit device according to claim 11, wherein nitrogen atom content of the nitrogen atoms in the buffer layer gradually increases with decreasing distance from the bottom electrode.

17. The integrated circuit device according to claim 11, further comprising:
 an interfacial film disposed between the dielectric structure and the top electrode, the interfacial film comprising a third metal oxide film, the third metal oxide film comprising a third metal,
 wherein the third metal comprises Ti or Zr.

18. An integrated circuit device comprising:
 a substrate;
 a bottom electrode disposed over the substrate, the bottom electrode comprising a first metal;
 a top electrode disposed over the bottom electrode;
 a dielectric structure disposed between the bottom electrode and the top electrode, the dielectric structure comprising:
  a crystallization induction film comprising a first metal oxide film, the first metal oxide film comprising the first metal, and the crystallization induction film disposed over a surface of the bottom electrode;
  a first dielectric film disposed on the crystallization induction film, the first dielectric film having a first band gap; and
  a second dielectric film disposed on the first dielectric film, the second dielectric film having a second band gap that is greater than the first band gap; and
 a buffer layer disposed between the bottom electrode and the crystallization induction film, the buffer layer comprising the first metal, oxygen atoms, and nitrogen atoms.

19. The integrated circuit device according to claim 18, wherein the first dielectric film comprises:
 a first local region disposed on the crystallization induction film; and
 a second local region integrally connected to the first local region and disposed at a distal end of the first dielectric film apart from the crystallization induction film.

20. The integrated circuit device according to claim 18, wherein the bottom electrode has an outer wall having a step, and
 an end of the buffer layer contacts the step.

* * * * *